United States Patent
Yun et al.

(10) Patent No.: US 11,355,194 B2
(45) Date of Patent: *Jun. 7, 2022

(54) NON-VOLATILE MEMORY DEVICE

(71) Applicant: SAMSUNG ELECTRONICS CO., LTD., Suwon-si (KR)

(72) Inventors: Kyunghwa Yun, Suwon-si (KR); Chanho Kim, Suwon-si (KR); Pansuk Kwak, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/942,299

(22) Filed: Jul. 29, 2020

(65) Prior Publication Data

US 2020/0388336 A1    Dec. 10, 2020

Related U.S. Application Data

(63) Continuation-in-part of application No. 16/705,395, filed on Dec. 6, 2019, now Pat. No. 11,189,634.

(30) Foreign Application Priority Data

Jun. 5, 2019    (KR) .................. 10-2019-0066996

(51) Int. Cl.
  *G11C 16/08*     (2006.01)
  *G11C 16/10*     (2006.01)
  *H01L 27/11582*  (2017.01)
  *H01L 27/1157*   (2017.01)
  *H01L 27/11573*  (2017.01)

(52) U.S. Cl.
  CPC .............. *G11C 16/08* (2013.01); *G11C 16/10* (2013.01); *H01L 27/1157* (2013.01); *H01L 27/11573* (2013.01); *H01L 27/11582* (2013.01)

(58) Field of Classification Search
  CPC ..... G11C 16/08; G11C 16/10; G11C 16/0483; H01L 27/11582; H01L 27/1157; H01L 27/11573; H01L 27/11565
  See application file for complete search history.

(56) References Cited

U.S. PATENT DOCUMENTS 9,129,681 B2   9/2015  Rabkin et al.
9,761,602 B2   9/2017  Oh et al.
(Continued)

OTHER PUBLICATIONS

U.S. Office Action issued in corresponding U.S. Appl. No. 16/705,395 dated Mar. 3, 2021.

(Continued)

*Primary Examiner* — Tri M Hoang
(74) *Attorney, Agent, or Firm* — F. Chau & Associates, LLC

(57) ABSTRACT

A memory device including: a memory cell array disposed in a first semiconductor layer, the memory cell array including a plurality of wordlines extended in a first direction and stacked in a second direction substantially perpendicular to the first direction; and a plurality of pass transistors disposed in the first semiconductor layer, wherein a first pass transistor of the plurality of pass transistors is disposed between a first signal line of a plurality of signal lines and a first wordline of the plurality of wordlines, and wherein the plurality of signal lines are arranged at the same level as a common source line.

18 Claims, 31 Drawing Sheets

(56) References Cited

U.S. PATENT DOCUMENTS

| | | |
|---|---|---|
| 10,141,326 B1 | 11/2018 | Oh et al. |
| 10,446,244 B1 | 10/2019 | Diep et al. |
| 11,049,870 B2 * | 6/2021 | Sugisaki ........... H01L 27/11565 |
| 11,189,634 B2 * | 11/2021 | Yun ........................ G11C 16/10 |
| 2016/0247570 A1 | 8/2016 | Chang et al. |
| 2016/0343450 A1 | 11/2016 | Lee et al. |
| 2017/0186758 A1 | 6/2017 | Lee et al. |
| 2018/0130821 A1 | 5/2018 | Son et al. |
| 2019/0013326 A1 | 1/2019 | Hua et al. |
| 2019/0013466 A1 | 1/2019 | Park et al. |
| 2020/0006268 A1 * | 1/2020 | Takiar ..................... H01L 24/94 |
| 2020/0388336 A1 | 12/2020 | Yun et al. |

OTHER PUBLICATIONS

U.S. Office Action issued in corresponding U.S. Appl. No. 16/705,395 dated Jun. 7, 2021.

\* cited by examiner

FIG. 17

|  | PROGRAM | READ | ERASE |
|---|---|---|---|
| Sla (WLsel) | Vpgm (ex. 20V) | Vr (ex. 0V) | Ver (ex. 0V) |
| Slb (WLunsel) | Vpass (ex. 9V) | Vread (ex. 6V) | |

NON-VOLATILE MEMORY DEVICE

CROSS-REFERENCE TO RELATED APPLICATION

This application is a continuation-in-part of U.S. application Ser. No. 16/705,395, filed on Dec. 6, 2019, now U.S. Pat. No. 11,189,634, issued Nov. 30, 2021, which claims priority under 35 U.S.C. § 119 to Korean Patent Application No. 10-2019-0066996, filed on Jun. 5.20.19, in the Korean Intellectual Property Office, the disclosures of which are incorporated by reference herein in their entireties.

TECHNICAL FIELD

The inventive concept relates to a memory device, and more particularly, to a non-volatile memory device having a cell over periphery (COP) structure.

DISCUSSION OF RELATED ART

As information communication devices become more multifunctional, memory devices that are highly integrated and have a large capacity are in demand. As a size of a memory cell is reduced to increase the integration of a memory device, operation circuits and/or a wiring structure of the memory device have become complicated. Therefore, techniques for designing highly integrated memory devices with excellent electrical characteristics are being developed. In particular, to increase the integration of a memory device, the number of word lines stacked on a substrate in a vertical direction may be increased. In this case, however, the number of pass transistors connected to the word lines increases, and thus, a chip size may increase.

SUMMARY

According to an exemplary embodiment of the inventive concept, there is provided a memory device including: a memory cell array disposed in a first semiconductor layer, the memory cell array including a plurality of wordlines extended in a first direction and stacked in a second direction substantially perpendicular to the first direction; and a plurality of pass transistors disposed in the first semiconductor layer, wherein a first pass transistor of the plurality of pass transistors is disposed between a first signal line of a plurality of signal lines and a first wordline of the plurality of wordlines, and wherein the plurality of signal lines are arranged at the same level as a common source line.

According to an exemplary embodiment of the inventive concept, there is provided a memory device including: a memory cell array including a plurality of wordlines stacked in a vertical direction; and a plurality of vertical pass transistors, wherein a first vertical pass transistor of the plurality of vertical pass transistors includes a first vertical channel extending in the vertical direction between a first driving signal line and a first wordline of the plurality of wordlines, wherein the first vertical channel is disposed near an end of the first wordline, and wherein the first driving signal line is arranged in the same layer as a common source line.

According to an exemplary embodiment of the inventive concept, there is provided a memory device including: a first semiconductor layer including: a memory cell array including a plurality of wordlines stacked in a vertical direction; and a plurality of pass transistors, a first pass transistor of the plurality of pass transistors being connected to a driving signal line, wherein the driving signal line is connected to a gate line arranged on the same layer as a ground select line.

BRIEF DESCRIPTION OF THE DRAWINGS

The above and other features of the inventive concept will be more clearly understood by describing in detail exemplary embodiments thereof with reference to the accompanying drawings in which:

FIG. 17 illustrates a voltage applied to a word line driving signal line by a memory operation according to an exemplary embodiment of the inventive concept;

DETAILED DESCRIPTION OF THE EMBODIMENTS

Figure 1:
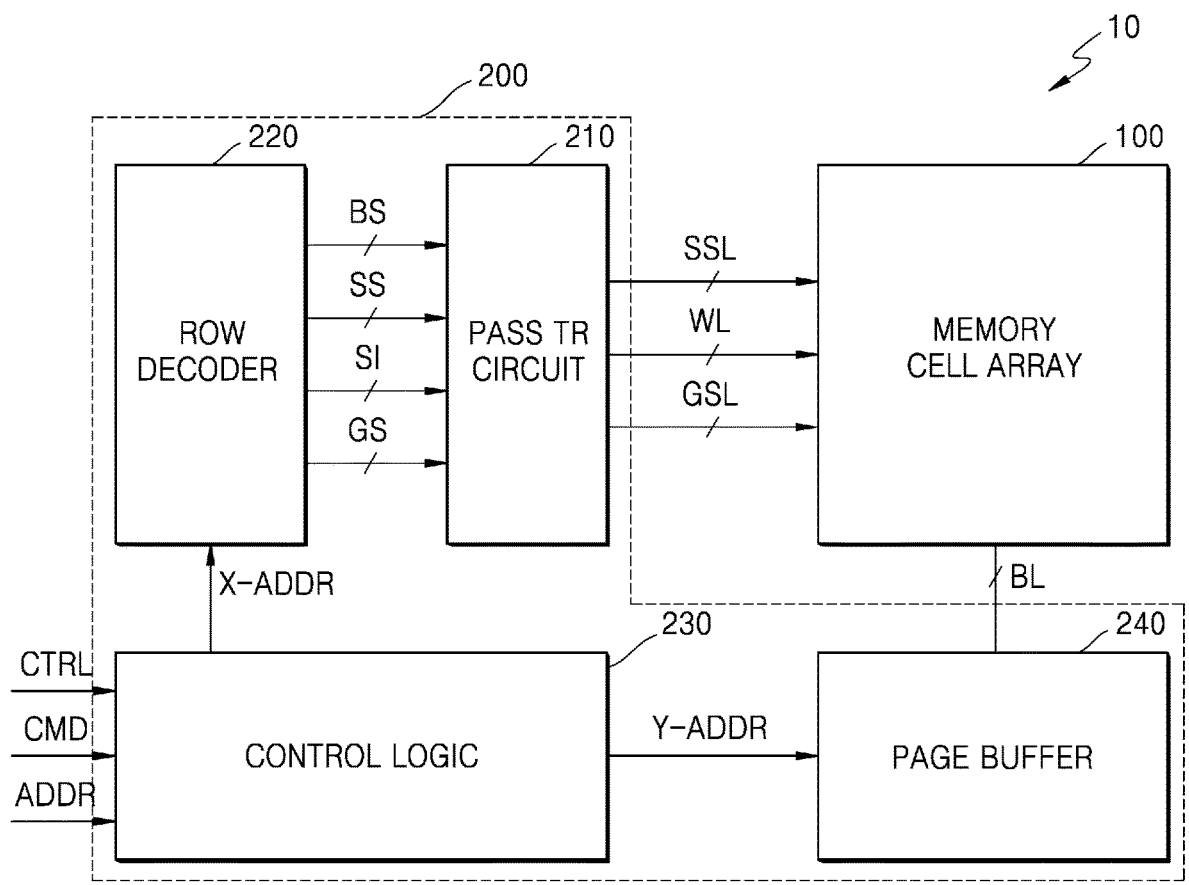
FIG. 1 is a block diagram illustrating a memory device according to an exemplary embodiment of the inventive concept.

Hereinafter, exemplary embodiments of the inventive concept will be described in detail with reference to the accompanying drawings. Like reference numerals may refer to like elements in the drawings.

FIG. 1 is a block diagram illustrating a memory device 10 according to an exemplary embodiment of the inventive concept.

Referring to FIG. 1, the memory device 10 may include a memory cell array 100 and a peripheral circuit 200. The peripheral circuit 200 may include a pass transistor circuit 210, a row decoder 220, a control logic 230, and a page buffer 240. The peripheral circuit 200 may further include a voltage generator, a data input and output circuit, an input and output interface, a column logic, a pre-decoder, a temperature sensor, a command decoder, or an address decoder. In exemplary embodiments of the inventive concept, the memory device 10 may be a non-volatile memory device. Hereinafter, "the memory device" may be referred to as the non-volatile memory device.

Figure 2:
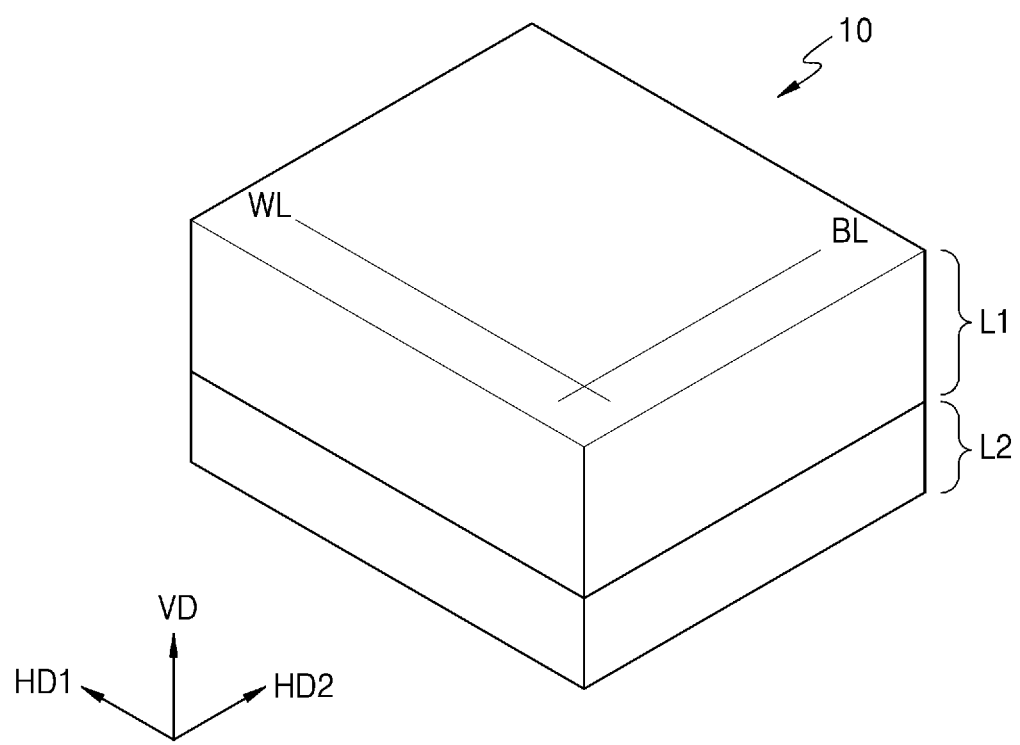
FIG. 2 illustrates a structure of a memory device according to an exemplary embodiment of the inventive concept.

In an exemplary embodiment of the inventive concept, the memory cell array 100, the pass transistor circuit 210, and the row decoder 220 may be arranged in an upper semiconductor layer (for example, L1 of FIG. 2) and the control logic 230 and the pager buffer 240 may be arranged in a lower semiconductor layer (for example, L2 of FIG. 2). However, the inventive concept is not limited thereto. In another exemplary embodiment of the inventive concept, the memory cell array 100 and the pass transistor circuit 210 may be arranged in the upper semiconductor layer and the row decoder 220, the control logic 230, and the page buffer 240 may be arranged in the lower semiconductor layer. In another exemplary embodiment of the inventive concept, partial circuits among circuits that configure the row decoder 220 may be arranged in the upper semiconductor layer together with the memory cell array 100 and the pass transistor circuit 210, and the control logic 230, the page buffer 240 and other partial circuits among the circuits that configure the row decoder 220 may be arranged in the lower semiconductor layer.

Figure 6:
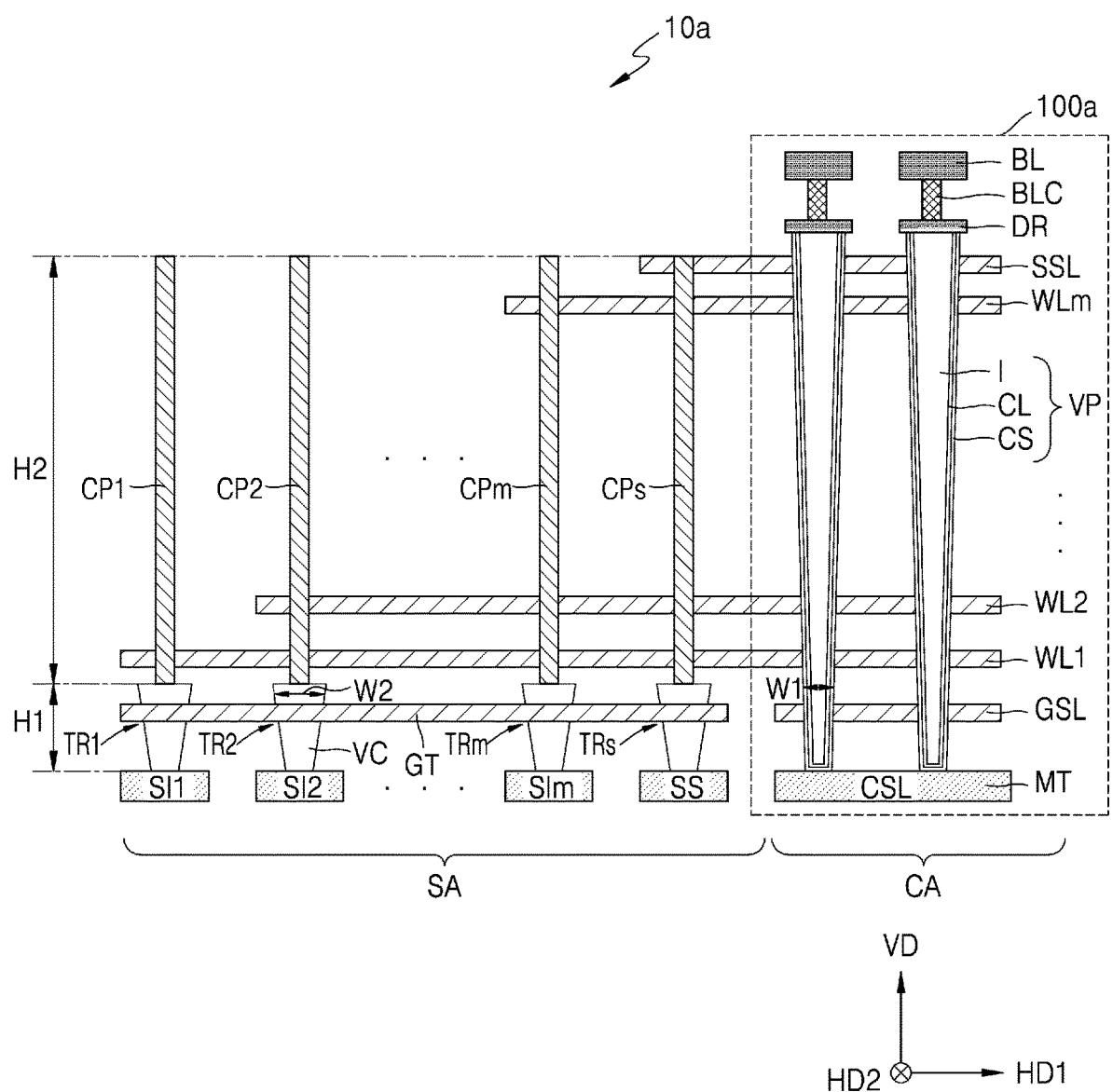
FIG. 6 is a cross-sectional view illustrating a memory device including the pass transistor circuit of FIG. 5, according to an exemplary embodiment of the inventive concept.

In an exemplary embodiment of the inventive concept, the pass transistor circuit 210 may include a plurality of vertical pass transistors (for example, TR1 to TRs of FIG. 6). For example, the plurality of vertical pass transistors may be arranged in the upper semiconductor layer. In an exemplary embodiment of the inventive concept, the pass transistor circuit 210 may include a plurality of vertical pass transistors (for example, TR1 to TRm of FIG. 22) and a plurality of normal pass transistors (for example, TRn of FIG. 22). For example, the plurality of vertical pass transistors may be arranged in the upper semiconductor layer and the plurality of normal pass transistors may be arranged in the lower semiconductor layer. In this case, a first part of the pass transistor circuit 210 may be arranged on the upper semiconductor layer and a second part of the pass transistor circuit 210 may be arranged on the lower semiconductor layer.

The memory cell array 100 may be connected to the page buffer 240 through bit lines BL and may be connected to the pass transistor circuit 210 through word lines WL, string selection lines SSL, and ground selection lines GSL. In addition, the pass transistor circuit 210 may be connected to the row decoder 220 through block selection signal lines BS, string selection line driving signal lines SS, word line driving signal lines SI, and ground selection line driving signal lines GS. The string selection line driving signal lines SS, the word line driving signal lines S, and the ground selection line driving signal lines GS may be referred to as "driving signal lines".

In addition, the memory cell array 100 may include a plurality of memory cells and the memory cells may be, for example, flash memory cells. Hereinafter, exemplary embodiments of the inventive concept will be described in detail with reference to an example in which the plurality of memory cells are NAND flash memory cells. However, the inventive concept is not limited thereto. In some exemplary embodiments of the inventive concept, the plurality of memory cells may be resistive memory cells such as resistive random access memory (ReRAM), phase change RAM (PRAM), or magnetic RAM (MRAM).

In an exemplary embodiment of the inventive concept, the memory cell array 100 may include a three-dimensional memory cell array, the three-dimensional memory cell array may include a plurality of NAND strings, and each of the NAND strings may include memory cells respectively connected to word lines vertically stacked on a substrate. This configuration will be described with reference to FIGS. 3 and 4. The following patent documents, which are hereby incorporated by reference in their entireties, describe configurations for three-dimensional memory arrays, in which the three-dimensional memory array is configured as a plurality of levels, with word lines and/or bit lines shared between levels: U.S. Pat. Nos. 7,679,133, 8,553,466, 8,654, 587, and 8,559,235 and the U.S. Patent Publication No. 2011/0233648. However, the inventive concept is not limited thereto. In some exemplary embodiments of the inventive concept, the memory cell array 100 may include a two-dimensional memory cell array and the two-dimensional memory cell array may include the plurality of NAND strings arranged in row and column directions.

The control logic 230 may generate various control signals for programming data to the memory cell array 100, reading data from the memory cell array 100, or erasing data stored in the memory cell array 100 based on a command CMD, an address ADDR, and a control signal CTRL. For example, the control logic 230 may output a row address X-ADDR and to the row decoder 220 a column address Y-ADDR to the page buffer 240. Therefore, the control logic 230 may control various operations in the memory device 10.

The row decoder 220 may output a block selection signal for selecting one of a plurality of memory blocks to the block selection signal lines BS in response to the row address X-ADDR. In addition, the row decoder 220 outputs a word line driving signal for selecting one of the word lines WL of a selected memory block to the word line driving signal lines SI, outputs a string selection line driving signal for selecting one of the string selection lines SSL to the string selection line driving signal lines SS, and may output a ground selection line driving signal for selecting one of the ground selection lines GSL to the ground selection line driving signal lines GS in response to the row address X-ADDR. The page buffer 240 may select partial bit lines among the bit lines BL in response to the column address Y-ADDR. For example, the page buffer 240 operates as a writing driver or a sense amplifier in accordance with an operation mode.

As the number of stages of the memory cells arranged in the memory cell array 100 increases, in other words, as the number of word lines WL stacked in a vertical direction increases, the number of vertical pass transistors for driving the word lines WL increases. Therefore, an area occupied by the pass transistor circuit 210 increases. On the other hand, as the number of word lines WL stacked in the vertical direction increases, an area of the memory cell array 100 is reduced. In a case in which the memory device 10 is implemented by a cell over periphery (COP) structure, when the area of the memory cell array 100 is reduced, since an area of a peripheral circuit arranged below the memory cell array 100 is also reduced, the entire peripheral circuit 200 may not be arranged below the memory cell array 100.

According to the present embodiment of the inventive concept, the pass transistor circuit 210 may be arranged in a stair area (for example, SA of FIG. 6) of the word lines WL. In other words, the pass transistor circuit 210 may be located in an area where the word lines WL have a staircase shape. In an exemplary embodiment of the inventive concept, the pass transistor circuit 210 may include a plurality of vertical pass transistors arranged in the stair area of the word lines WL. Therefore, since an area in which the pass transistor circuit 210 is arranged overlaps the stair area of the word lines WL, even though the number of vertical pass transistors is increased in accordance with an increase in the number of stacked word lines WL, it is possible to prevent a chip size of the memory device 10 from increasing.

FIG. 2 illustrates a structure of a memory device 10 according to an exemplary embodiment of the inventive concept.

Referring to FIGS. 1 and 2, the memory device 10 may include a first semiconductor layer L1 and a second semiconductor layer L2 and the first semiconductor layer L1 may be stacked on the second semiconductor layer L2 in a vertical direction VD. For example, the second semiconductor layer L2 may be arranged below the first semiconductor layer L1 in the vertical direction VD.

In an exemplary embodiment of the inventive concept, the memory cell array 100, the pass transistor circuit 210, and the row decoder 220 may be formed in the first semiconductor layer L1 and the control logic 230 and the page buffer 240 may be formed in the second semiconductor layer L2. Therefore, the memory device 10 may have a structure in which the memory cell array 100 is arranged on a partial peripheral circuit, in other words, the COP structure. In the COP structure, a horizontal direction area may be reduced and integrity of the memory device 10 may increase.

In an exemplary embodiment of the inventive concept, the second semiconductor layer L2 may include a substrate. Circuits including the control logic 230 and the page buffer 240 may be formed in the second semiconductor layer L2 by forming semiconductor devices such as transistors and a pattern for wiring the devices on the substrate. After the circuits are formed in the second semiconductor layer L2, the first semiconductor layer L1 including the memory cell array 100, the pass transistor circuit 210, and the row decoder 220 may be formed and patterns for electrically connecting the bit lines BL of the memory cell array 100 to the circuits formed in the second semiconductor layer L2 or patterns for electrically connecting the row decoder 220 to the circuits formed in the second semiconductor layer L2 may be formed.

Figure 3:
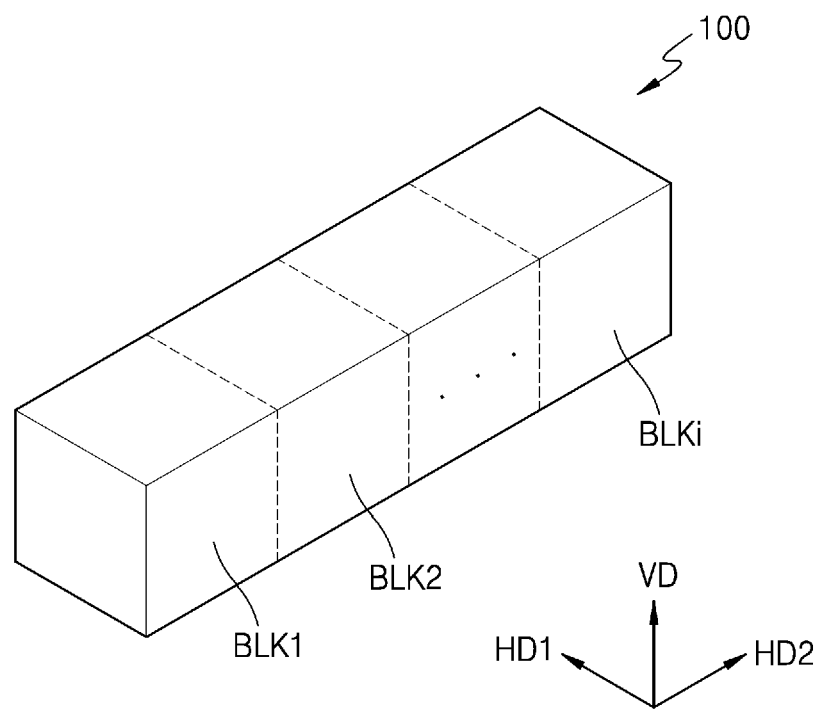
FIG. 3 illustrates a memory cell array according to an exemplary embodiment of the inventive concept.

FIG. 3 illustrates a memory cell array 100 according to an exemplary embodiment of the inventive concept.

Referring to FIG. 3, the memory cell array 100 may include a plurality of memory blocks BLK1 to BLKi ('i' may be a positive integer). Each of the plurality of memory blocks BLK1 to BLKi may have a three-dimensional structure (or a vertical structure). For example, each of the plurality of memory blocks BLK1 to BLKi may include a plurality of NAND strings that extend in the vertical direction VD. In this case, the plurality of NAND strings may be spaced apart from each other by a certain distance in first and second horizontal directions HD1 and HD2. The plurality of memory blocks BLK1 to BLK1 may be selected by the row decoder (220 of FIG. 1). For example, the row decoder 220 may select a memory block corresponding to a block address among the plurality of memory blocks BLK1 to BLK1.

Figure 4:
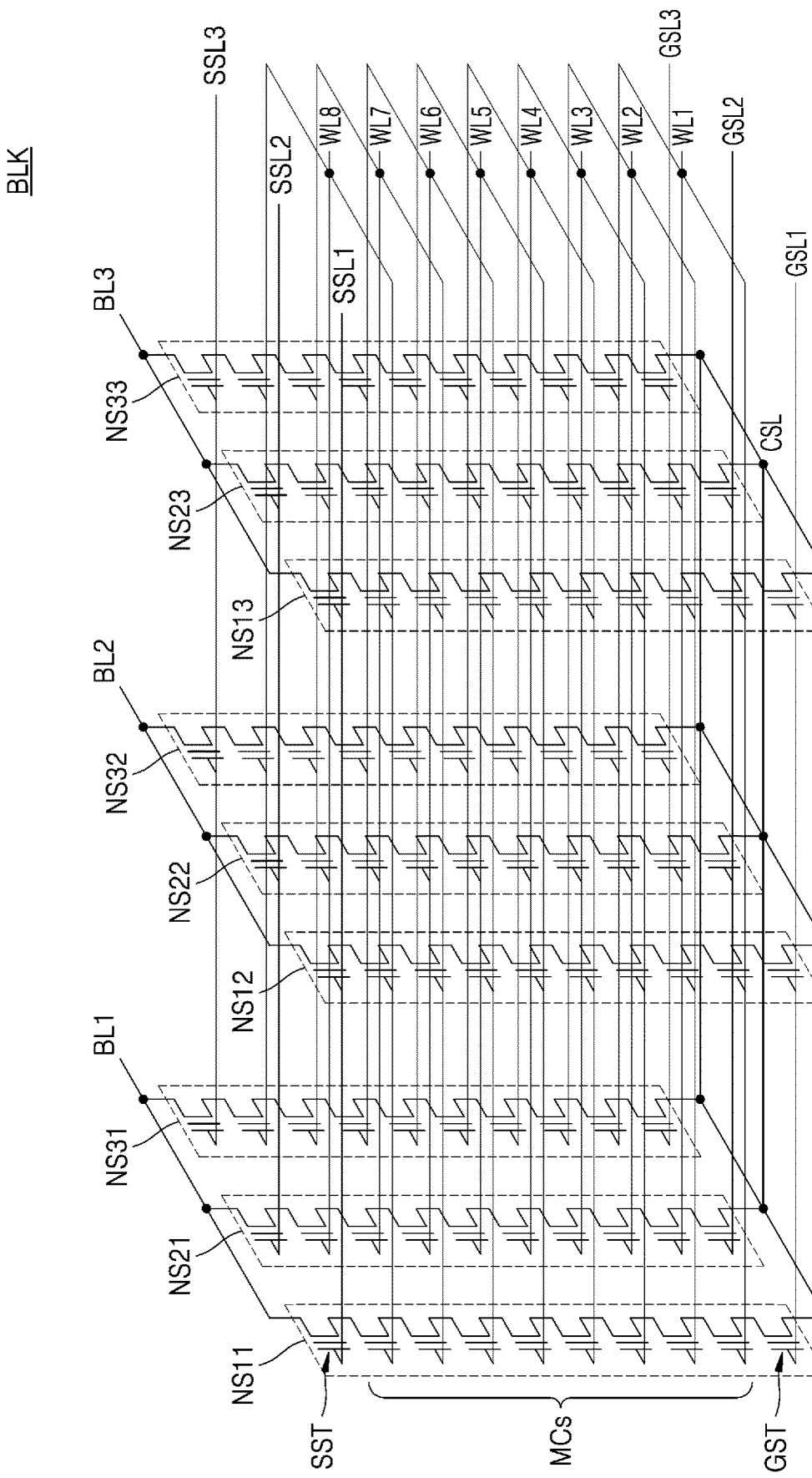
FIG. 4 illustrates an equivalent circuit of a memory block according to an exemplary embodiment of the inventive concept.

FIG. 4 illustrates an equivalent circuit of a memory block BLK according to an exemplary embodiment of the inventive concept. For example, the memory block BLK may correspond to one of the plurality of memory blocks BLK1 to BLKi of FIG. 3.

Referring to FIG. 4, the memory block BLK may include a plurality of NAND strings NS11, NS12, NS13, NS21, NS22, NS23, NS31, NS32 and NS33, a plurality of word lines WL1, WL2, WL3, WL4, WL5, WL6, WL7 and WL8, a plurality of bit lines BL1, BL2 and BL3, a plurality of ground selection lines GSL1, GSL2 and GSL3, a plurality of string selection lines SSL1, SSL2 and SSL3, and a common source line CSL. Here, the number of NAND strings, the number of word lines, the number of bit lines, the number of ground selection lines, and the number of string selection lines may vary in accordance with an exemplary embodiment of the inventive concept.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each NAND string (for example, NS11) may include a string selection transistor SST, a plurality of memory cells MCs, and a ground selection transistor GST that are serially connected to each other.

The string selection transistor SST is connected to the corresponding string selection lines SSL1 to SSL3. The plurality of memory cells MCs are respectively connected to the corresponding word lines WL1 to WL8. The ground selection transistor GST is connected to the corresponding ground selection lines GSL1 to GSL3. The string selection transistor SST is connected to the corresponding bit lines BL1 to BL3 and the ground selection transistor GST is connected to the common source line CSL.

In the present embodiment of the inventive concept, a word line (for example, WL1) having the same height is commonly connected, the string selection lines SSL1 to SSL3 are separate from each other, and the ground selection lines GSL1 to GSL3 are separate from each other. In FIG. 4, it is illustrated that the string selection lines SSL1 to SSL3 share the word line having the same height. However, the inventive concept is not limited thereto. For example, two string selection lines may share a word line having the same height. In another example, four string selection lines may share a word line having the same height.

Figure 5:
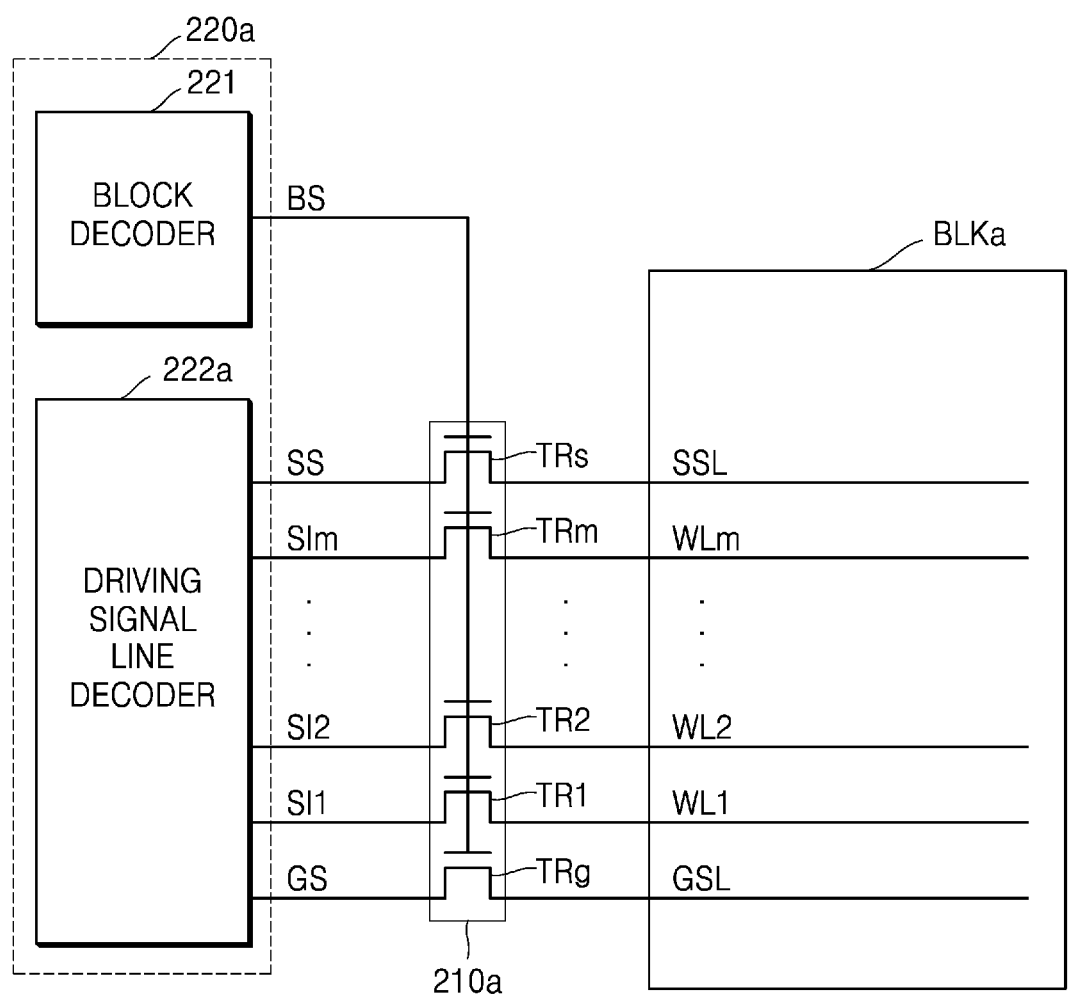
FIG. 5 illustrates a row decoder and a pass transistor circuit, according to an exemplary embodiment of the inventive concept.

FIG. 5 illustrates a row decoder 220a and a pass transistor circuit 210a according to an exemplary embodiment of the inventive concept.

Referring to FIG. 5, a memory block BLKa may correspond to one of the memory blocks BLK1 to BLKi of FIG. 3 and 'a' may be a positive integer. The row decoder 220a may be an example of the row decoder 220 of FIG. 1 and the pass transistor circuit 210a may be an example of the pass transistor circuit 210 of FIG. 1. Therefore, contents described above in detail with reference to FIGS. 1 to 4 may be applied to the current embodiment.

The row decoder 220a may include a block decoder 221 and a driving signal line decoder 222a. The pass transistor circuit 210a may include a plurality of vertical pass transistors TRs, TR1 to TRm, and TRg and 'm' may be a positive integer. The pass transistor circuit 210a may be provided in each of the memory blocks (BLK1 to BLKi of FIG. 3) and the block decoder 221 and the driving signal line decoder 222a may be commonly provided to the memory blocks (BLK1 to BLKi of FIG. 3).

The block decoder 221 may be connected to the pass transistor circuit 210a through a block selection signal line BS. For example, the block selection signal line BS may be connected to gates of the plurality of vertical pass transistors TRs, TR1 to TRm. and TRg. For example, when the block selection signal provided through the block selection signal line BS is activated, the plurality of vertical pass transistors TRs, TR1 to TRm, and TRg are turned on. Therefore, the memory block BLKa may be selected.

The driving signal line decoder 222a may be connected to the pass transistor circuit 210a through a string selection line driving signal line SS, word line driving signal lines SI1 to SIm, and a ground selection line driving signal line GS. For example, the string selection line driving signal line SS, the word line driving signal lines SI1 to SIm, and the ground selection line driving signal line GS may be respectively connected to sources of the plurality of vertical pass transistors TRs, TR1 to TRm, and TRg.

The pass transistor circuit 210a may be connected to the memory block BLKa through a ground selection line GSL, a plurality of word lines WL1 to WLm, and a string selection line SSL. The vertical pass transistors TR1 to TRm may respectively connect the plurality of word lines WL1 to WLm to the corresponding word line driving signal lines SI1 to Sm. The vertical pass transistor TRs may connect the string selection line SSL to the corresponding string selection line driving signal line SS. The vertical pass transistor TRg may connect the ground selection line GSL to the corresponding ground selection line driving signal line GS. Drains of the vertical pass transistors TRs, TR1 to TRm, and TRg may be connected to the memory block BLKa. For example, when the block selection signal is activated, the vertical pass transistors TRs, TR1 to TRm, and TRg may respectively provide driving signals provided through the string selection line driving signal line SS, the word line driving signal lines SI1 to SIm, and the ground selection line driving signal line GS to the string selection line SSL, the plurality of word lines WL1 to WLm, and the ground selection line GSL.

In an exemplary embodiment of the inventive concept, the vertical pass transistors TRs and TR1 to TRm may be implemented by vertical pass transistors. In the current specification, "the vertical pass transistor" may be a transistor including a vertical channel. For example, the vertical pass transistors TRs and TR1 to TRm may be arranged in a stair area (for example, SA of FIG. 6) of word lines. In an exemplary embodiment of the inventive concept, the vertical pass transistor TRg may be implemented by a normal pass transistor. In the current specification, "the normal pass transistor" may be a transistor including a horizontal channel. For example, the vertical pass transistor TRg may be arranged in a decoder area (for example, DAa of FIG. 23), which will be described in detail with reference to FIGS. 6 to 8.

FIG. 6 is a cross-sectional view illustrating a memory device 10a including the pass transistor circuit of FIG. 5 according to an exemplary embodiment of the inventive concept.

Referring to FIG. 6, the memory device 10a may include a memory cell array 100a, the plurality of vertical pass transistors TR1 to TRm and TRs, and the plurality of driving signal lines SI1 to SIm and SS. For example, the memory device 10a may correspond to a part of the first semiconductor layer L1 of FIG. 2 and a page buffer or a control logic may be arranged below the memory cell array 100a, the plurality of vertical pass transistors TR1 to TRm and TRs, and the plurality of driving signal lines SI1 to SIm and SS in a vertical direction VD.

The memory cell array 100a may be arranged in a cell area CA and may include the plurality of word lines WL1 to WLm. The plurality of word lines WL1 to WLm may be stacked in the vertical direction VD and may extend in the first horizontal direction HDL. The plurality of word lines WL1 to WLm may be electrically insulated through a plurality of insulating layers. One end of each of the plurality of word lines WL1 to WLm in the first horizontal direction HD1 may be implemented in a stair-shape. In the current specification, the stair shape is located in a stair area (SA).

In addition, the memory cell array 100a may further include the common source line CSL arranged below the plurality of word lines WL1 to WLm. In an exemplary embodiment of the inventive concept, the common source line CSL and the plurality of driving signal lines SI1 to SIm and SS may be arranged at the same level. For example, the common source line CSL and the plurality of driving signal lines SI1 to SIm and SS may be arranged at the same level along the first horizontal direction HD1. In an exemplary embodiment of the inventive concept, the common source line CSL and the plurality of driving signal lines SI1 to SIm and SS may be implemented by a metal layer MT. For example, the common source line CSL may be implemented by a metal plate or a conductive flat plate of the metal layer MT.

In addition, the memory cell array 100a may further include a vertical channel structure VP. The vertical channel structure VP may extend in the vertical direction VD and may pass through the plurality of word lines WL1 to WLm and a plurality of insulating layers. The vertical channel structure VP may be referred to as a vertical pillar. In an exemplary embodiment of the inventive concept, the vertical channel structure VP may have a first width W1 in the first horizontal direction HD1. For example, a plurality of vertical channel structures VP may be annularly formed. In this case, the first width W1 may correspond to a first channel hole size. However, the inventive concept is not limited thereto. The vertical channel structure VP may be in a form of an elliptical column or a rectangular column. The plurality of vertical channel structures VP may be spaced apart from each other in the first horizontal direction HD1 and the second horizontal direction HD2.

In an exemplary embodiment of the inventive concept, the vertical channel structure VP may include a charge storage layer CS, a channel layer CL, and an internal layer I. The channel layer CL may include a first type (for example, p-type) silicon material and may function as a channel area. The internal layer I may include an insulating material such as a silicon oxide or an air gap. The charge storage layer CS may include a gate insulating layer (also referred to as 'a tunneling insulating layer'), a charge trap layer, and a blocking insulating layer. For example, the charge storage layer CS may have an oxide-nitride-oxide (ONO) structure.

Drains or drain contacts DR are respectively provided on the plurality of vertical channel structures VP. For example, the drains or the drain contacts DR may include a silicon material doped with second type (for example, n-type) impurities. The bit lines BL may be provided above the drain contacts DR and may be respectively connected to the drain contacts DR through bit line contacts BLC.

In addition, the memory cell array 100a may further include the ground selection line GSL between the plurality of word lines WL1 to WLm and the common source line CSL and the string selection line SSL arranged above the plurality of word lines WL1 to WLm. In FIG. 6, it is illustrated that the memory device 10a includes one string selection line SSL. However, the inventive concept is not limited thereto. In some embodiments of the inventive concept, the memory device 10a may include two string selection lines (for example, SSLu and SSLd of FIG. 12) stacked in the vertical direction VD.

The plurality of vertical pass transistors TR1 to TRm and TRs may be arranged in the stair area SA of the plurality of word lines WL1 to WLm. The plurality of vertical pass transistors TR1 to TRm may be respectively connected between corresponding word lines and corresponding driving signal lines. For example, the first vertical pass transistor TR1 may be connected between the first word line WL1 and the first word line driving signal line SI1, the second vertical pass transistor TR2 may be connected between the second word line WL2 and the second word line driving signal line SI2, and the mth vertical pass transistor TRm may be connected between the mth word line WLm and the mth word line driving signal line SIm. The vertical pass transistor TRs may be connected between the string selection line SSL and the string selection line driving signal line SS.

Each of the plurality of vertical pass transistors TR1 to TRm and TRs may include a vertical channel VC that extends in the vertical direction VD. For example, the vertical channel VC of the first vertical pass transistor TR1 may extend vertically from the first word line driving signal line SI1. The vertical channel VC may have a second width W2 greater than the first width W1. Therefore, a breakdown issue associated with the plurality of vertical pass transistors TR1 to TRm and TRs may be resolved. For example, the second width W2 may be about no less than twice the first width W1. However, the inventive concept is not limited thereto. According to an exemplary embodiment of the inventive concept, the first and second widths W1 and W2 may vary. In an exemplary embodiment of the inventive concept, heights of the plurality of vertical channels VC in the vertical direction VD may be equal to each other as the first height H1. In an exemplary embodiment of the inventive concept, top surface levels of the plurality of vertical channels VC may be lower than a bottom surface level of the first word line WL1. In an exemplary embodiment of the inventive concept, top surface levels of the plurality of vertical channels VC may be disposed between the bottom surface level of the first word line WL1 and a gate line.

In an exemplary embodiment of the inventive concept, the vertical channel VC may be formed to have the same structure as that of the vertical channel structure VP through the same process as that of the vertical channel structure VP. Therefore, the vertical channel VC may also include the charge storage layer CS, the channel layer CL, and the internal layer I. However, the inventive concept is not limited thereto. In some embodiments of the inventive concept, the vertical channel VC may include only the channel layer CL and the internal layer I.

In addition, the vertical channels VC respectively included in the plurality of vertical pass transistors TR1 to TRm and TRs may be commonly connected to a gate GT. In the current embodiment, the gate GT commonly connected to the plurality of vertical pass transistors TR1 to TRm and TRs may be arranged at the same level as that of the ground selection line GSL. In some embodiments of the inventive concept, the vertical channels VC included in the plurality of vertical pass transistors TR1 to TRm and TRs may be respectively connected to different gates GT and lengths of the different gates GT in the vertical direction VD may be different from each other. Therefore, driving abilities of the plurality of vertical pass transistors TR1 to TRm and TRs may be different from each other.

In some embodiments of the inventive concept, a length of the gate GT in the vertical direction VD may be equal to that of the ground selection line GSL in the vertical direction VD. However, the inventive concept is not limited thereto. In an exemplary embodiment of the inventive concept, the length of the gate GT in the vertical direction VD may be equal to that of each of the word lines WL1 to WLm in the vertical direction VD. However, the inventive concept is not limited thereto. In an exemplary embodiment of the inventive concept, the length of the gate GT in the vertical direction VD may be equal to that of the string selection line SSL in the vertical direction VD. However, the inventive concept is not limited thereto.

A plurality of contacts CP1 to CPm and CPs may be respectively arranged on the plurality of vertical pass transistors TR1 to TRm and TRs. The plurality of vertical pass transistors TR1 to TRm may be respectively connected to the corresponding word lines WL1 to WLm through the corresponding contacts CP1 to CPm and the vertical pass transistor TRs may be connected to the string selection line SSL through the contact CPs. In an exemplary embodiment of the inventive concept, heights of the plurality of contacts CP1 to CPm and CPs in the vertical direction VD may be equal to each other as the second height H2. For example, top surface levels of the plurality of contacts CP1 to CPm and CPs may be equal to a top surface level of the string selection line SSL In an exemplary embodiment of the inventive concept, the row decoder 220a may be adjacent to the plurality of vertical pass transistors TR1 to TRm and TRs in the first horizontal direction HD1 or the second horizontal direction HD2.

However, the inventive concept is not limited thereto. At least one of the block decoder 221 and the driving signal line decoder 222a may be arranged below the plurality of vertical pass transistors TR1 to TRm and TRs in the vertical direction VD.

Figure 7:
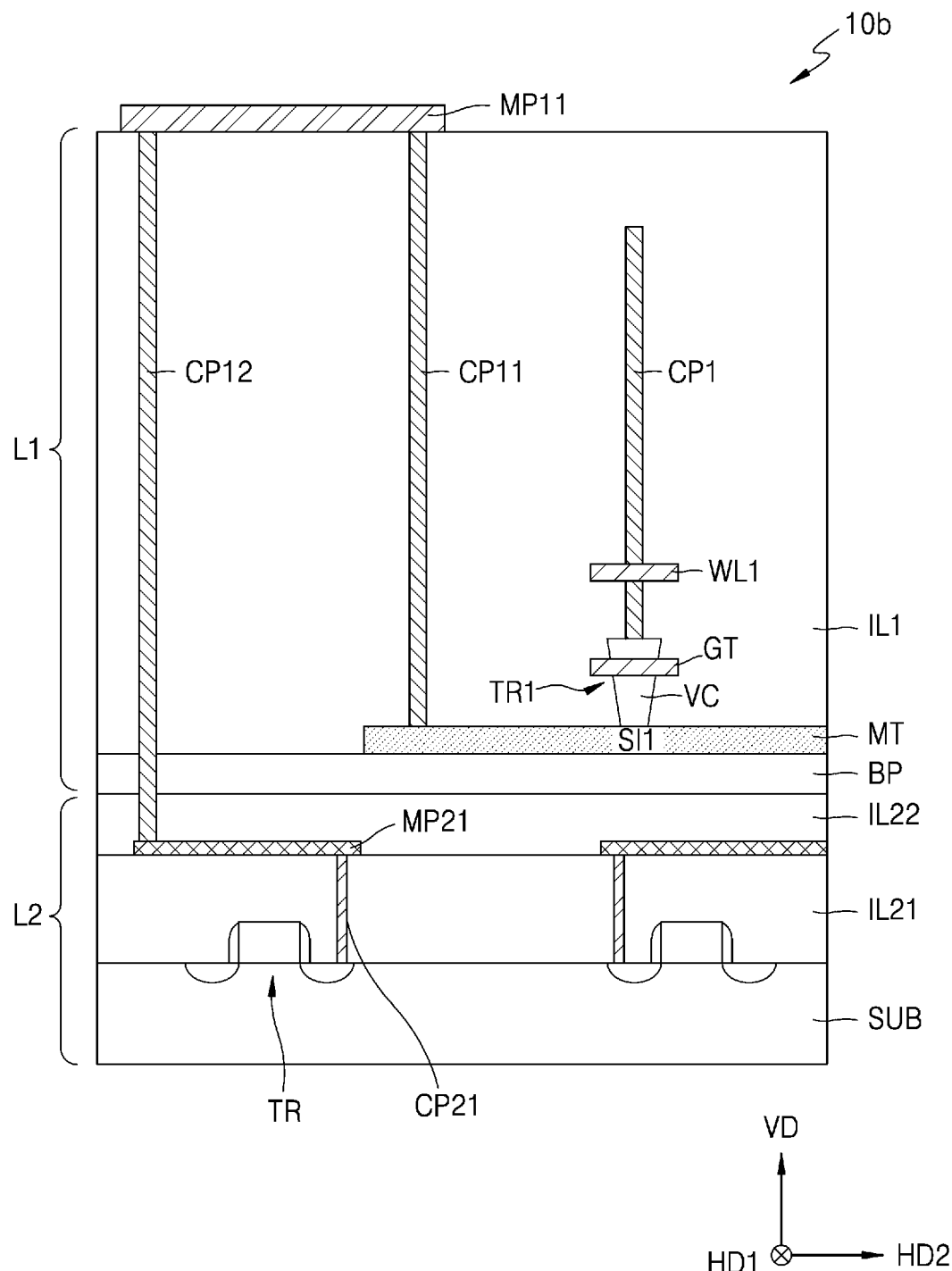
FIG. 7 is a cross-sectional view illustrating a memory device including the pass transistor circuit of FIG. 5, according to an exemplary embodiment of the inventive concept.

FIG. 7 is a cross-sectional view illustrating a memory device 10b including the pass transistor circuit of FIG. 5 according to an exemplary embodiment of the inventive concept.

Referring to FIG. 7, the memory device 10b may include a first semiconductor layer L1 and a second semiconductor layer L2 and may correspond to a modification of the memory device 10a illustrated in FIG. 6. The second semiconductor layer L2 may include a substrate SUB, a first lower insulating layer IL21, and a second lower insulating layer IL22. For example, the control logic 230 or the page buffer 240 of FIG. 1 may be arranged in the second semiconductor layer L2.

The substrate SUB may be a semiconductor substrate including a semiconductor material such as single crystal silicon or single crystal germanium (Ge) and may be manufactured from a silicon wafer. The first and second lower insulating layers IL21 and IL22 may be formed of an insulating material such as a silicon oxide by a chemical vapor deposition (CVD) process or a spin coating process. A plurality of semiconductor devices including a transistor TR may be formed on the substrate SUB included in the second semiconductor layer L2. The transistor TR may be electrically connected to a metal pattern MP21 formed in the second lower insulating layer IL22 through a contact CP21 that passes through the first lower insulating layer IL21.

The first semiconductor layer L1 may be stacked on the second semiconductor layer L2. For example, the pass transistor circuit 210a and the memory block BLKa of FIG. 5 may be arranged in the first semiconductor layer L1. The first semiconductor layer L1 may include a base layer BP and the upper insulating layer IL1. In an exemplary embodiment of the inventive concept, the base layer BP may be formed of poly-silicon by a sputtering process, the CVD process, an atomic layer deposition (ALD) process, or a physical vapor deposition (PVD) process.

In an exemplary embodiment of the inventive concept, the base layer BP may be formed by forming an amorphous silicon layer on the second lower insulating layer IL22 and changing the amorphous silicon layer to a single crystal silicon layer by performing thermal treatment on the amorphous silicon layer or irradiating a laser beam onto the amorphous silicon layer. Therefore, a defect in the base layer BP may be removed. In an exemplary embodiment of the inventive concept, the base layer BP may be formed by a wafer bonding process. In this case, the base layer BP may be formed on the second lower insulating layer IL22 by attaching a single crystal silicon wafer onto the second lower insulating layer IL22 and partially removing or planarizing a top of the single crystal silicon wafer.

The first word line driving signal line SI1 may be arranged on the base layer BP and may extend in the second horizontal direction HD2. The first word line driving signal line SI1 may be electrically connected to the transistor TR included in the second semiconductor layer L2 through contacts CP11 and CP12 and a metal pattern MP11. For example, the transistor TR formed in the second semiconductor layer L2 may configure a circuit corresponding to the driving signal line decoder 222a of FIG. 5.

Figure 8:
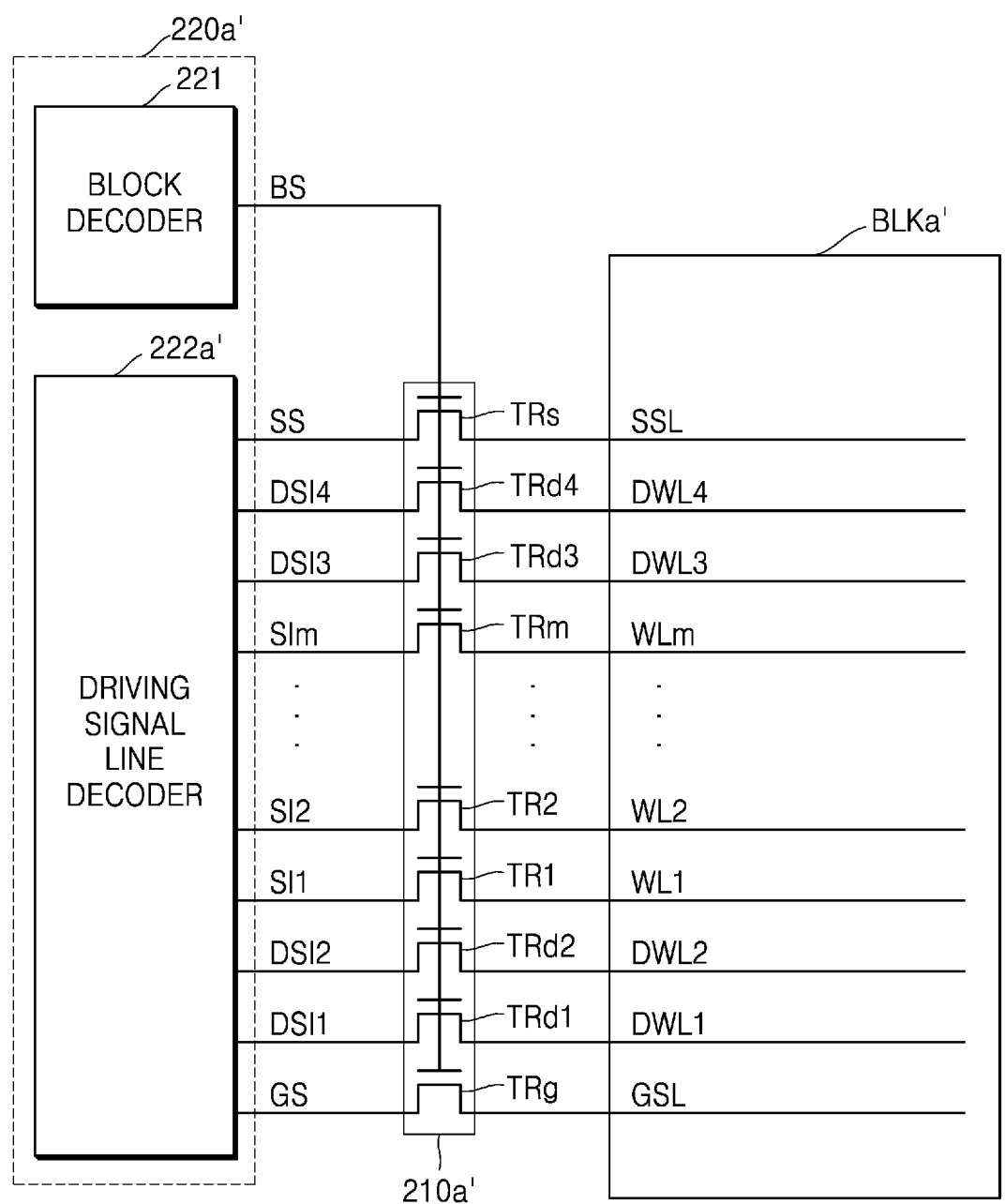
FIG. 8 illustrates a row decoder and a pass transistor circuit, according to an exemplary embodiment of the inventive concept.

FIG. 8 illustrates a row decoder 220a' and a pass transistor circuit 210a' according to an exemplary embodiment of the inventive concept.

Referring to FIG. 8, a memory block BLKa' may correspond to one of the memory blocks BLK1 to BLKi of FIG. 3. The memory block BLKa' may further include first to fourth dummy word lines DWL1, DWL2, DWL3 and DWL4 in comparison with the memory block BLKa of FIG. 5. The first and second dummy word lines DWL1 and DWL2 may be arranged between the ground selection line GSL and the first word line WL1 and the third and fourth dummy word lines DWL3 and DWL4 may be arranged between the mth word line WLm and the string selection line SSL. In some embodiments of the inventive concept, the memory block BLKa' may include at least one of the first to fourth dummy word lines DWL1 to DWL4. According to exemplary embodiments of the inventive concept, the number of dummy word lines included in the memory block BLKa' may vary.

The row decoder 220a' may correspond to a modification of the row decoder 220a of FIG. 5 and the pass transistor circuit 210a' may correspond to a modification of the pass transistor circuit 210 of FIG. 5. The pass transistor circuit 210a' may further include vertical pass transistors TRd1, TRd2, TRd3 and TRd4 in comparison with the pass transistor circuit 210 of FIG. 5 The vertical pass transistors TRd1 to TRd4 may respectively connect the dummy word lines DWL1 to DWL4 to corresponding dummy word line driving signal lines DSI1, DSI2, DSI3 and DSI4.

Figure 9:
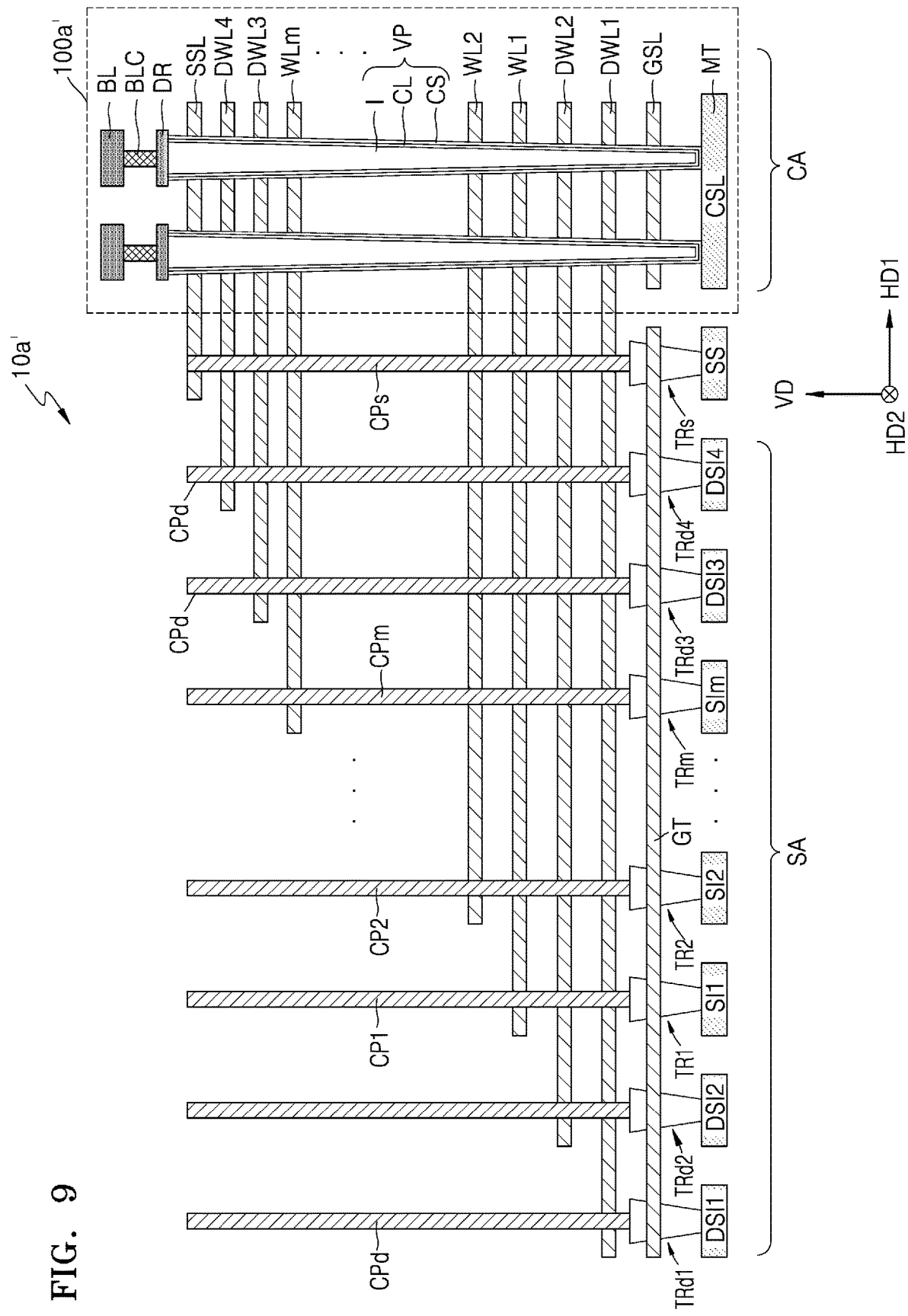
FIG. 9 is a cross-sectional view illustrating a memory device including the pass transistor circuit of FIG. 8, according to an exemplary embodiment of the inventive concept.

FIG. 9 is a cross-sectional view schematically illustrating a memory device 10a' including the pass transistor circuit of FIG. 8 according to an exemplary embodiment of the inventive concept.

Referring to FIG. 9, the memory device 10a' may include a memory cell array 100a', the plurality of vertical pass transistors TR1 to TRm, TRs, and Trd1 to TRd4, the word line driving signal lines SI1 to SIm, the string selection line driving signal line SS, and the dummy word line driving signal lines DSI1 to DSI4. The plurality of vertical pass transistors TR1 to TRm, TRs, and Trd1 to TRd4 may be commonly connected to the same gate GT. Lengths of contacts CPd respectively arranged above the dummy word line driving signal lines DSI1 to DSI4 in the vertical direction VD may be equal to those of the contacts CP1, CP2, and CPm respectively arranged above the word line driving signal lines SI to SIm in the vertical direction VD. The memory device 10a' corresponds to a modification of the memory device 10a of FIG. 6. Contents described above with reference to FIGS. 6 and 7 are applied to the current embodiment.

Figure 10:
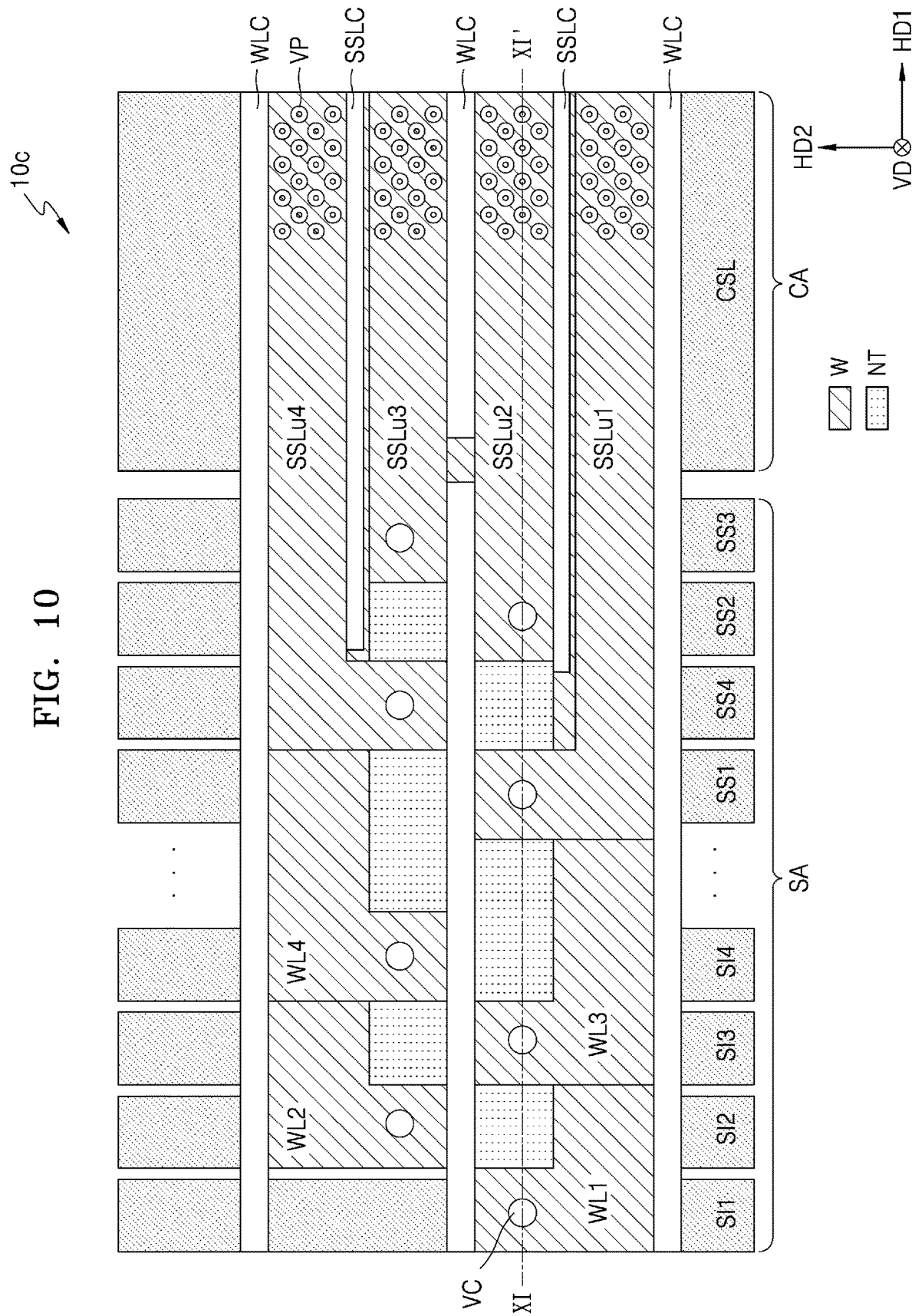
FIG. 10 is a top view illustrating a memory device including the pass transistor circuit of FIG. 5, according to an exemplary embodiment of the inventive concept.
Figure 11:
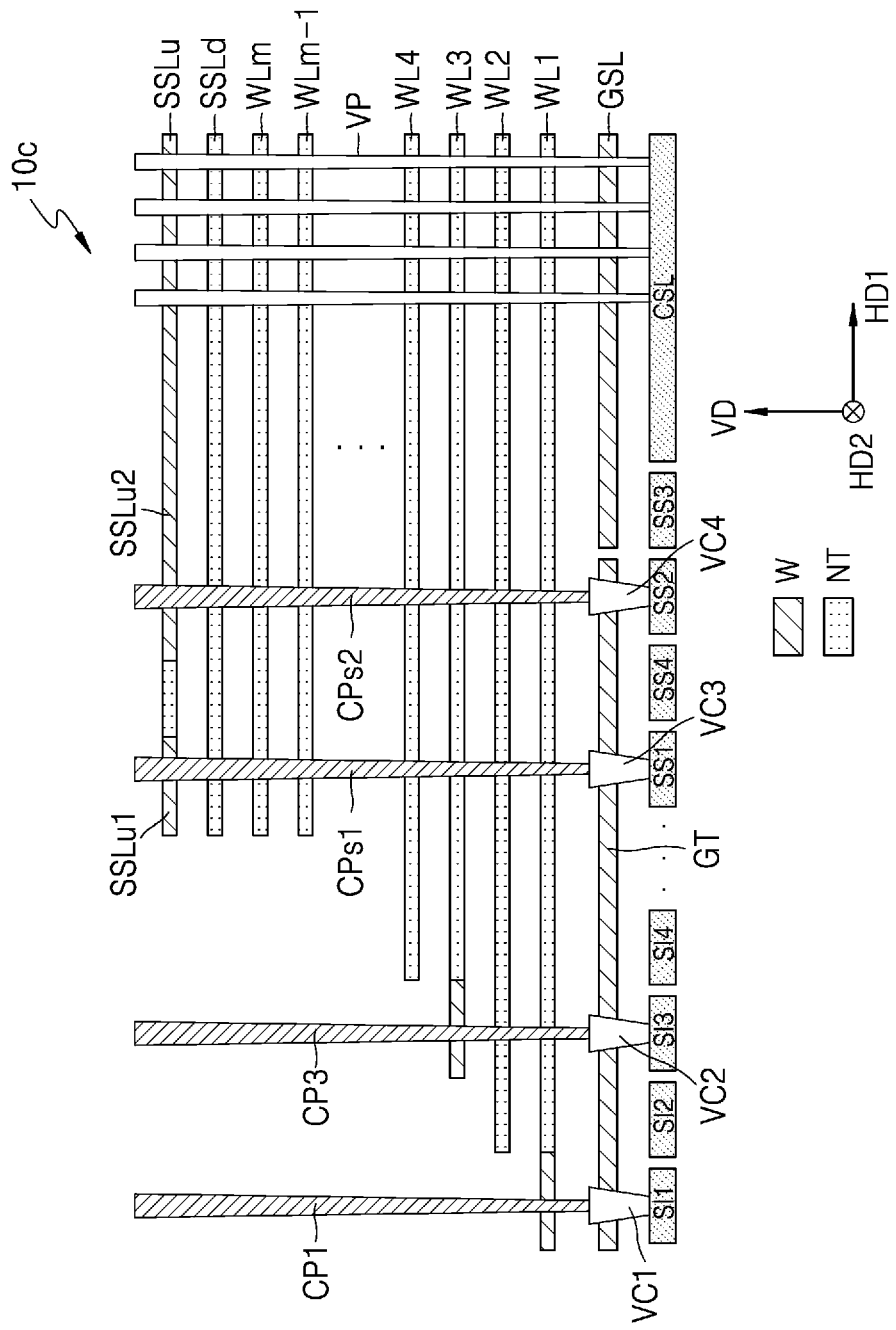
FIG. 11 is a cross-sectional view taken along line XI-XI' of FIG. 10, according to an exemplary embodiment of the inventive concept.

FIG. 10 is a top view illustrating a memory device 10c including the pass transistor circuit of FIG. 5 according to an exemplary embodiment of the inventive concept. FIG. 11 is a cross-sectional view taken along line XI-XI' of FIG. 10 according to an exemplary embodiment of the inventive concept.

Referring to FIGS. 10 and 11, a plurality of driving signal lines SI1, SI2, SI3 and SI4 and SS1, SS2, SS3 and SS4 and the common source line CSL may be arranged at the same level. For example, the plurality of driving signal lines SI1 to S4 and SS1 to SS4 and the common source line CSL may be formed by the same process. In an exemplary embodiment of the inventive concept, the plurality of driving signal lines SI1 to S4 and SS1 to SS4 extend in the second horizontal direction HD2 and may be spaced apart from each other in the first horizontal direction HD1. In an exemplary embodiment of the inventive concept, the common source line CSL extends in the second horizontal direction HD2 and may be implemented by a metal plate. The plurality of driving signal lines SI1 to SI4 and SS1 to SS4 may also be implemented by a metal plate.

The first to fourth word lines WL1 to WL4 may be formed to be stair-shaped in the stair area SA. The first word line WL1 may be arranged above the gate GT in the vertical direction VD and may include a tungsten area W and a nitride area NT. Here, the tungsten area W may include, for example, a conductive material such as W without being limited to W. The contact CP1 may pass through the tungsten area W of the first word line WL1. In addition, the nitride area NT may include an insulating material such as a nitride without being limited to a nitride. The second to fourth word lines WL2 to WL4 may be sequentially stacked above the first word line WL1 in the vertical direction VD. The first word line WL1 may be connected to a vertical channel VC1 through the contact CP1 and the vertical channel VC1 may be connected to the first word line driving signal line SI1. The third word line WL3 may be connected to a vertical channel VC2 through the contact CP3 and the vertical channel VC2 may be connected to the third word line driving signal line SI3. The third word line WL3 may also include a tungsten area W through which the contact CP3 passes. The first to fourth word lines WL1 to WL4 may extend in the first horizontal direction HD1 and a word line arranged at the same level may be divided by a word line cut area WLC.

First, second, third and fourth upper string selection lines SSLu1, SSLu2, SSLu3 and SSLu4 may be arranged at the same level and may be divided by a string selection line cut area SSLC. The first upper string selection line SSLu1 may be connected to a vertical channel VC3 through a contact CPs1 and the vertical channel VC3 may be connected to a string selection line driving signal line SS. The second upper string selection line SSLu2 may be connected to a vertical channel VC4 through a contact CPs2 and the vertical channel VC4 may be connected to a string selection line driving signal line SS2. The first and second upper string selection lines SSLu1 and SSLu2 may include tungsten W.

Figure 12:
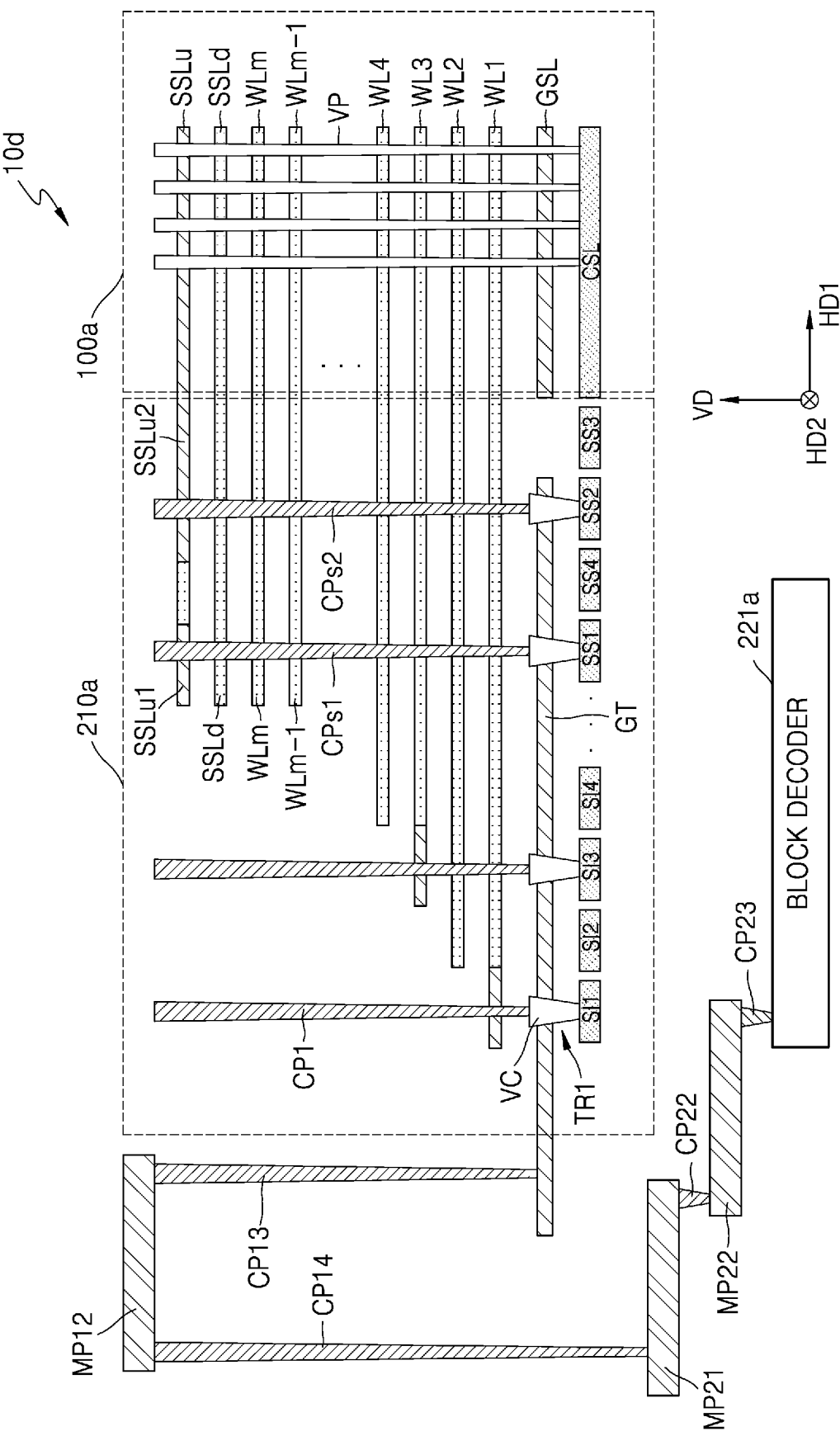
FIG. 12 is a cross-sectional view illustrating a memory device including the pass transistor circuit of FIG. 5 according to an exemplary embodiment of the inventive concept.

FIG. 12 is a cross-sectional view illustrating a memory device 10d including the pass transistor circuit of FIG. 5 according to an exemplary embodiment of the inventive concept.

Referring to FIG. 12, the memory device 10d may include the memory cell array 100a, the pass transistor circuit 210a, and the block decoder 221a and the block decoder 221a may be arranged below the pass transistor circuit 210a in the vertical direction VD. The memory device 10d corresponds to a modification of the memory device 10c of FIG. 11 and the description previously given thereto is omitted.

The gate GT commonly connected to the vertical channels VC may be connected to the block decoder 221a through a wiring line including contacts CP13, CP14, CP22, and CP23 and metal patterns MP12, MP21, and MP22. In other words, a block selection signal BS output from the block decoder 221a may be provided to the gate GT through the wiring line including the contacts CP13, CP14, CP22, and CP23 and the metal patterns MP12, MP21, and MP22. In this case, the block selection signal BS may turn on the transistors connected to the gate GT. The metal patterns MP21 and MP22, the contacts CP22 and CP23, and the block decoder 221a may be arranged in the second semiconductor layer L2 of FIG. 2.

Figure 13:
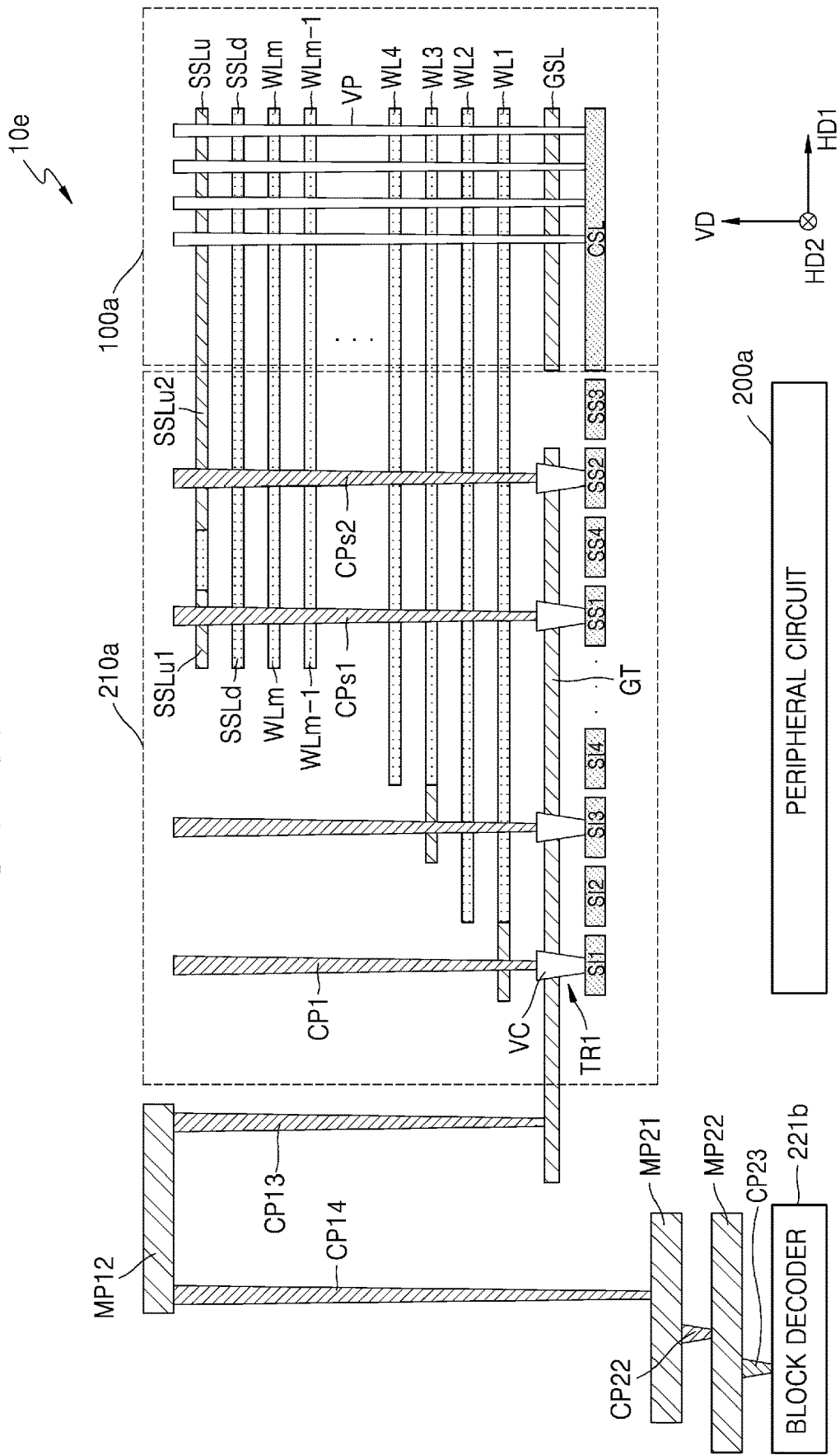
FIG. 13 is a cross-sectional view illustrating a memory device including the pass transistor circuit of FIG. 5 according to an exemplary embodiment of the inventive concept.

FIG. 13 is a cross-sectional view illustrating a memory device 10e including the pass transistor circuit of FIG. 5 according to an exemplary embodiment of the inventive concept.

Referring to FIG. 13, the memory device 10e may include the memory cell array 100a, the pass transistor circuit 210a, a block decoder 221b, and a peripheral circuit 200a and the peripheral circuit 200a may be arranged below the pass transistor circuit 210a in the vertical direction VD. In this case, the block decoder 221b may be adjacent to the peripheral circuit 200a in the first horizontal direction HD1. However, the inventive concept is not limited thereto. The block decoder 221b may be adjacent to the peripheral circuit 200a in the second horizontal direction HD2. The memory device 10e corresponds to a modification of the memory device 10c of FIG. 11 and the description previously given thereto is omitted.

The gate GT commonly connected to the vertical channels VC may be connected to the block decoder 221b through the wiring line including the contacts CP13, CP14, CP22, and CP23 and the metal patterns MP12, MP21, and MP22. In other words, the block selection signal BS output from the block decoder 221b may be provided to the gate GT through the wiring line including the contacts CP13, CP14, CP22, and CP23 and the metal patterns MP12, MP21, and MP22. For example, the metal patterns MP21 and MP22, the contacts CP22 and CP23, and the block decoder 221b, and the peripheral circuit 200a may be arranged in the second semiconductor layer L2 of FIG. 2.

Figure 14:
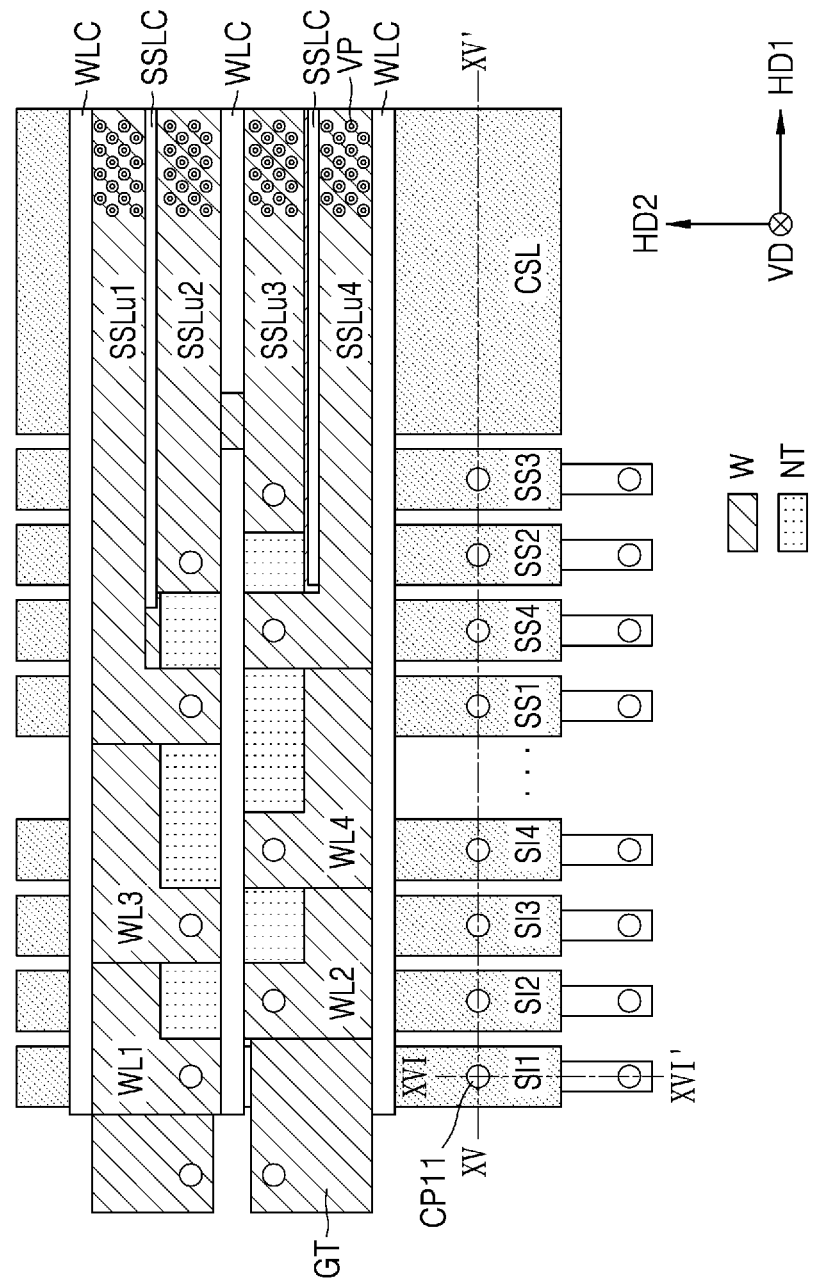
FIG. 14 is a top view illustrating a memory device including the pass transistor circuit of FIG. 5 according to an exemplary embodiment of the inventive concept.

FIG. 14 is a top view illustrating a memory device 10f including the pass transistor circuit of FIG. 5 according to an exemplary embodiment of the inventive concept.

Referring to FIG. 14, the plurality of driving signal lines SI1 to SI4 and SS1 to SS4 and the common source line CSL may be arranged at the same level. For example, the plurality of driving signal lines SI1 to S4 and SS1 to SS4 extend in the second horizontal direction HD2 and may be spaced apart from each other by a certain distance in the first horizontal direction HD1. The gate GT may be arranged above the plurality of driving signal lines SI1 to SI4 and SS1 to SS4 in the vertical direction VD and may extend in the first horizontal direction HD1. The first to fourth word lines WL1 to WL4 may be sequentially stacked above the gate GT in the vertical direction VD.

Figure 15:
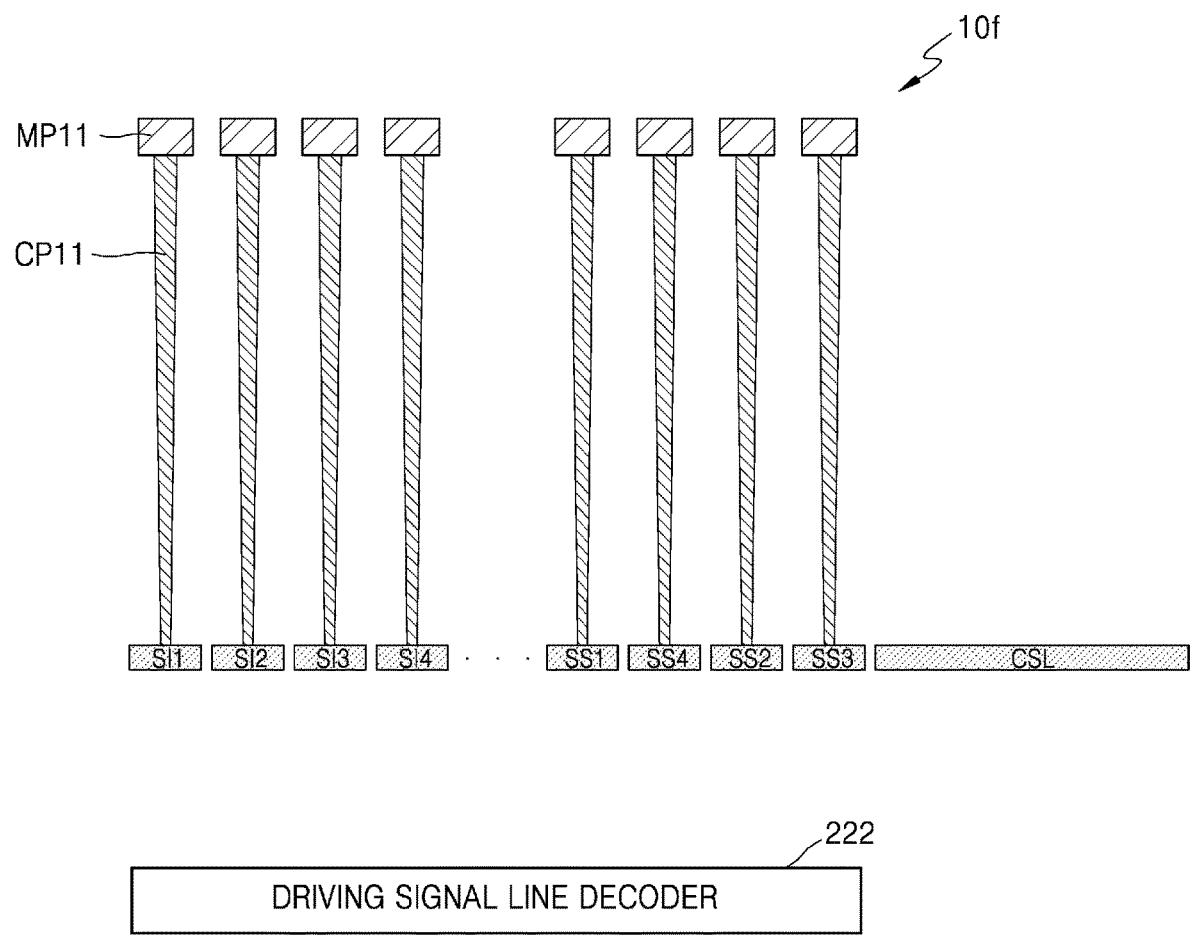
FIG. 15 is a cross-sectional view taken along line XV-XV' of FIG. 14 according to an exemplary embodiment of the inventive concept.

FIG. 15 is a cross-sectional view taken along line XV-XV' of FIG. 14 according to an exemplary embodiment of the inventive concept.

Referring to FIG. 15, the contacts CP11 may be respectively arranged on the plurality of driving signal lines SI1 to SI4 and SS1 to SS4 and the plurality of driving signal lines SI1 to SI4 and SS1 to SS4 may be electrically connected to metal patterns MP11, respectively, through the contacts CP11. In this case, a driving signal line decoder 222 may be arranged below the plurality of driving signal lines SI1 to SI4 and SS1 to SS4 in the vertical direction VD. The driving signal line decoder 222 may be arranged in the second semiconductor layer L2 of FIG. 2.

Figure 16:
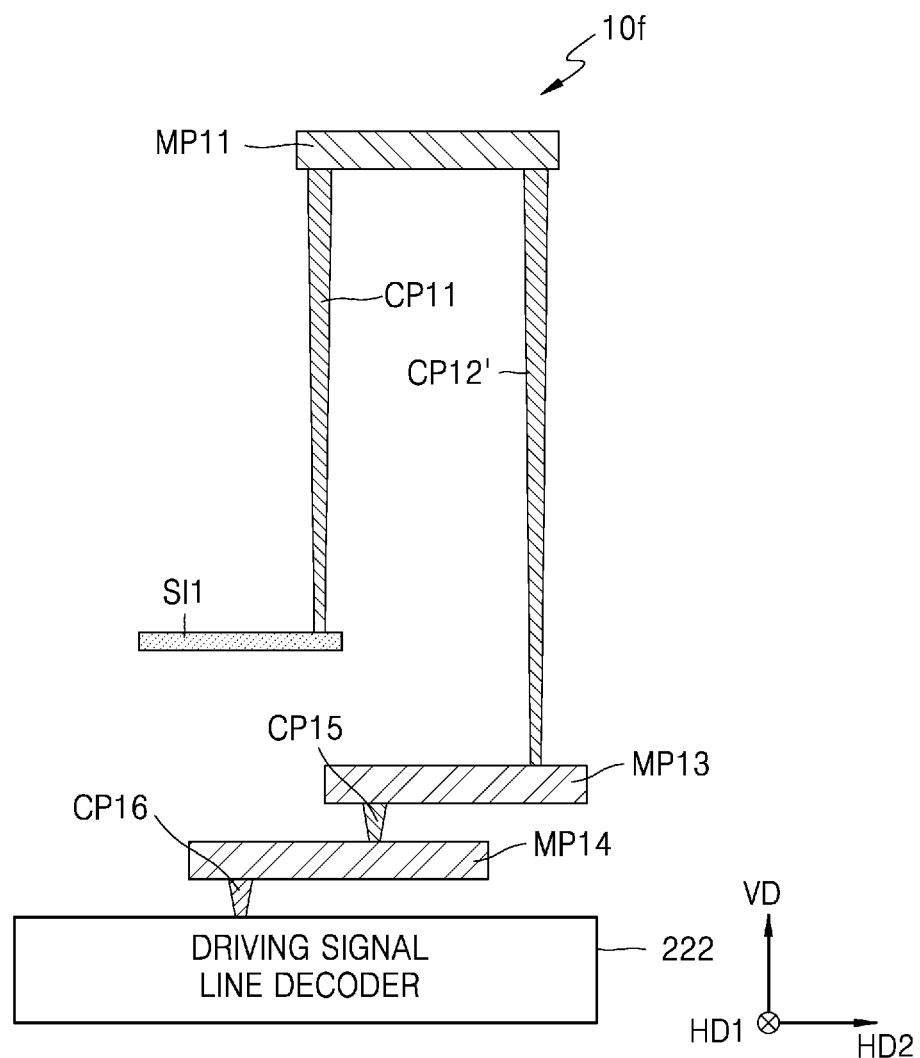
FIG. 16 is a cross-sectional view taken along line XVI-XVI' of FIG. 14 according to an exemplary embodiment of the inventive concept.

FIG. 16 is a cross-sectional view taken along the line XV-XV' of FIG. 14 according to an exemplary embodiment of the inventive concept.

Referring to FIG. 16, the word line driving signal line SI1 may be connected to the driving signal line decoder 222 through a wiring line including contacts CP11, CP12', CP15, and CP16 and metal patterns MP11, MP13, and MP14. In other words, the driving signal line decoder 222 may provide the word line driving signal to the first word line driving signal line SI1 through the wiring line including the contacts CP1, CP12', CP15, and CP16 and the metal patterns MP11, MP13, and MP14. For example, the word line driving signal may have a voltage level illustrated in FIG. 17.

FIG. 17 illustrates a voltage applied to a word line driving signal line by a memory operation according to an exemplary embodiment of the inventive concept.

Referring to FIG. 17, a selected word line driving signal line SIa corresponds to a driving signal line connected to a selected word line WLsel and an unselected word line driving signal line SIb may correspond to a driving signal line connected to an unselected word line WLunsel. During a program operation, a program voltage Vpgm (for example, about 20V) may be applied to the selected word line driving signal line SIa and a pass voltage Vpass (for example, about 9V) may be applied to an unselected word line driving signal line SIb. In an exemplary embodiment of the inventive concept, the program voltage Vpgm may be about 10V to about 25V and the pass voltage Vpass may be about 5V to about 15V. During a read operation, a read voltage Vr (for example, about 0V) may be applied to the selected word line driving signal line SIa and a read pass voltage Vread (for example, about 6V) may be applied to the unselected word line driving signal line SIb. In an exemplary embodiment of the inventive concept, the read voltage Vr may be about −1V to about 0V and the read pass voltage Vread may be about 4V to about 10V. During an erase operation, an erase voltage Ver (for example, about 0V) may be applied to both the selected word line driving signal line SIa and the unselected word line driving signal line SIb. In an exemplary embodiment of the inventive concept, the erase voltage Ver may be about −2V to about 3V.

Figure 18:
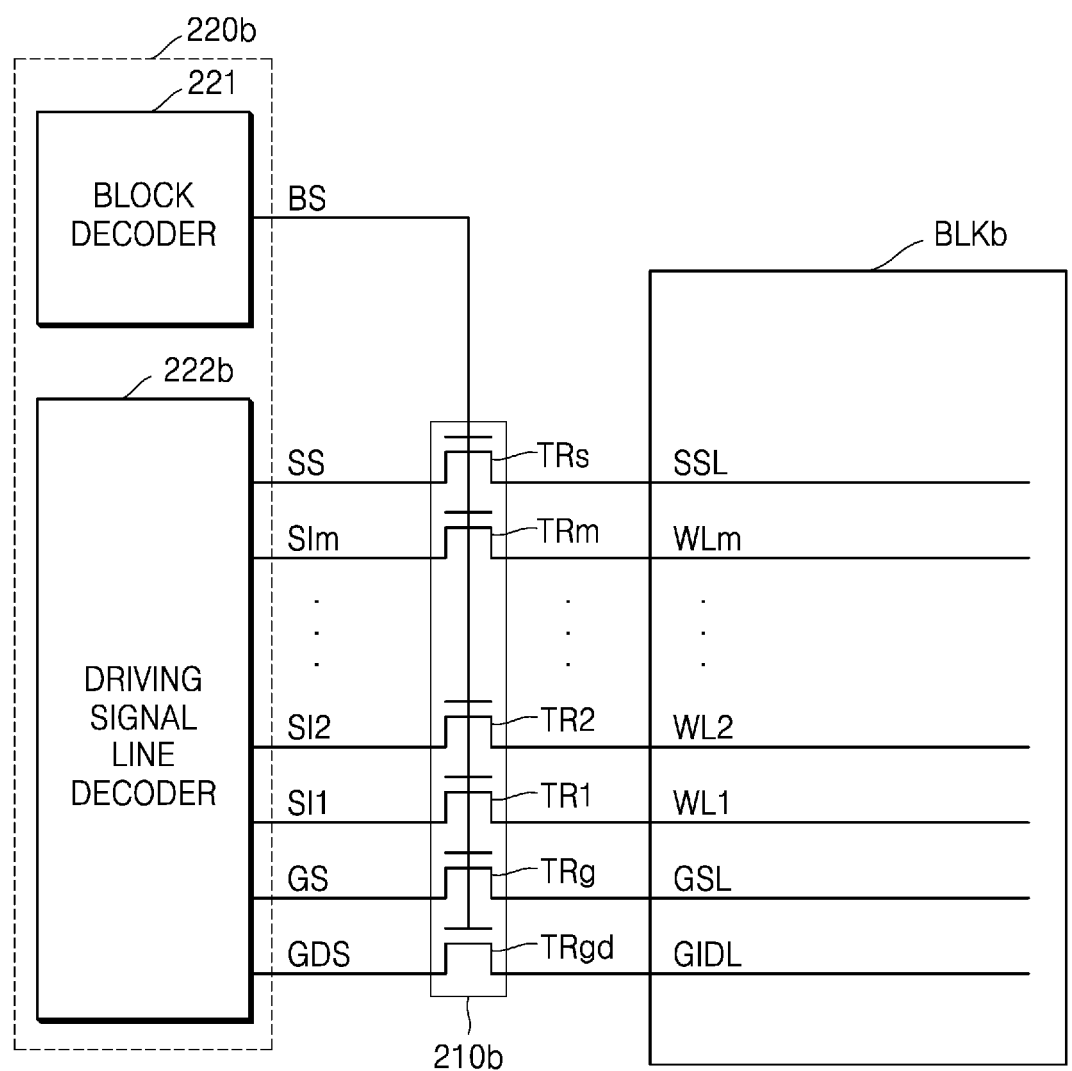
FIG. 18 illustrates a row decoder and a pass transistor circuit according to an exemplary embodiment of the inventive concept.

FIG. 18 illustrates a row decoder 220b and a pass transistor circuit 210b according to an exemplary embodiment of the inventive concept.

Referring to FIG. 18, a memory block BLKb may correspond to one of the memory blocks BLK1 to BLKi of FIG. 3 and 'b' may be a positive integer. The row decoder 220b may correspond to a modification of the row decoder 220a of FIG. 5 and the pass transistor circuit 210b may correspond to a modification of the pass transistor circuit 210a of FIG. 5. Therefore, the description previously given with reference to FIGS. 1 to 8 may be applied to the current embodiment. The row decoder 220b may include the block decoder 221 and a driving signal line decoder 222b. The pass transistor circuit 210b may include a plurality of vertical pass transistors TRs, TR1 to TRm, TRg, and TRgd.

The driving signal line decoder 222b may be connected to the pass transistor circuit 210b through the string selection line driving signal line SS, the word line driving signal lines SI1 to SIm, the ground selection line driving signal line GS, and a gate induced drain leakage (GIDL) gate driving signal line GDS. For example, the string selection line driving signal line SS, the word line driving signal lines SI1 to SIm, the ground selection line driving signal line GS, and the GIDL gate driving signal line GDS may be respectively connected to the plurality of vertical pass transistors TRs, TR1 to TRm, TRg, and TRgd.

The pass transistor circuit 210b may be connected to the memory block BLKb through the ground selection line GSL, the plurality of word lines WL1 to WLm, the string selection line SSL, and a GIDL gate line GIDL. The vertical pass transistor TRgd may be connected to the GIDL gate driving signal line GDS corresponding to the GIDL gate line GIDL. For example, when the block selection signal is activated, the plurality of vertical pass transistors TRs, TR1 to TRm, TRg, and TRgd may respectively provide driving signals provided through the string selection line driving signal line SS, the word line driving signal lines SI1 to SIm, the ground selection line driving signal line GS, and the GIDL gate driving signal line GDS to the string selection line SSL, the plurality of word lines WL1 to WLm, the ground selection line GSL, and the GIDL gate line GIDL.

In an exemplary embodiment of the inventive concept, the plurality of vertical pass transistors TRs, TR1 to TRm, and TRg may be implemented by vertical pass transistors. For example, the plurality of vertical pass transistors TRs, TR1 to TRm, and TRg may be arranged in the stair area (for example, SA of FIG. 6) of the word lines. In an exemplary embodiment of the inventive concept, the vertical pass transistor TRgd may be implemented by a normal pass transistor. For example, the vertical pass transistor TRgd may be arranged in the decoder area (for example, DAa of FIG. 23), which will be described in detail with reference to FIG. 19.

Figure 19:
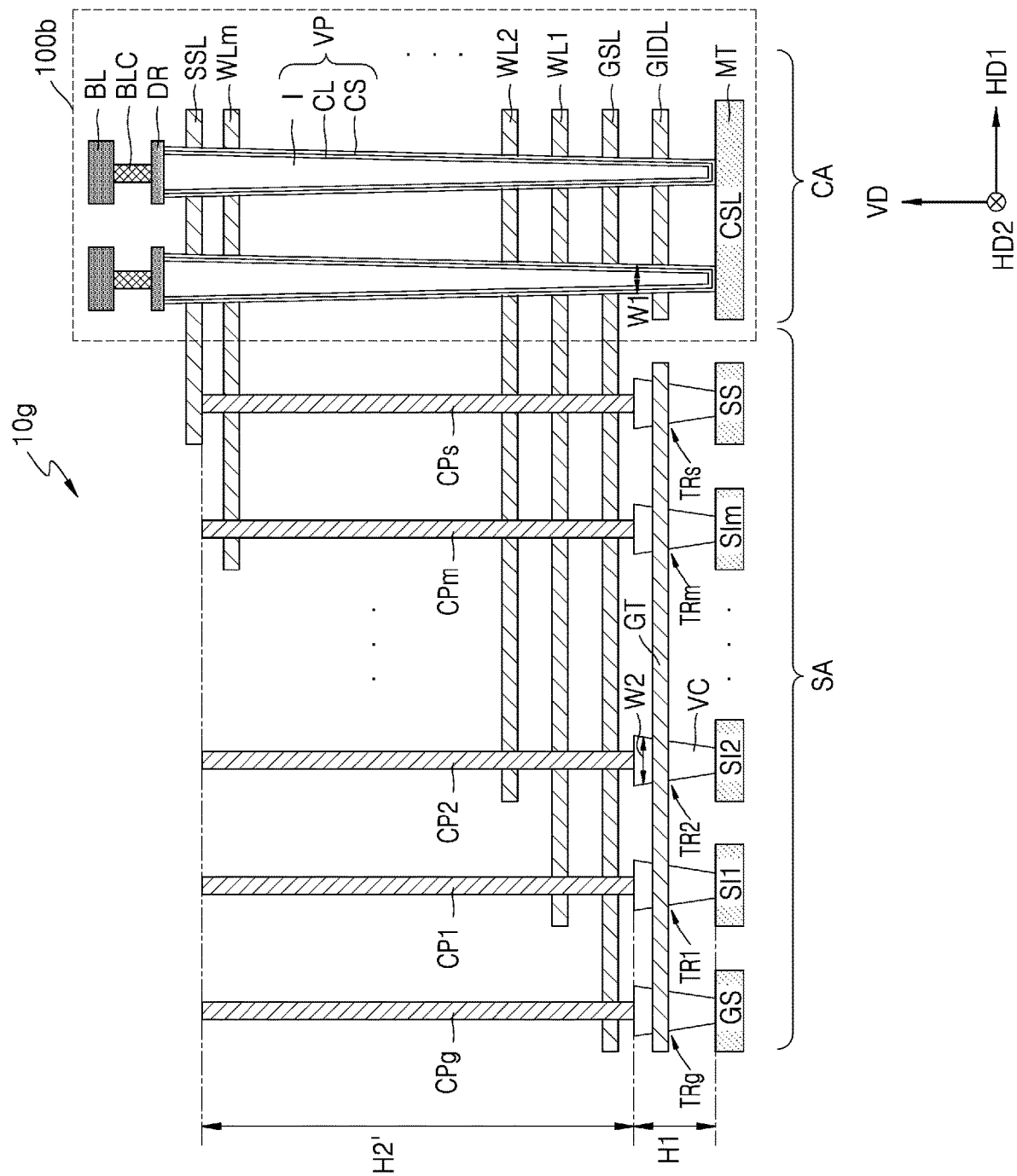
FIG. 19 is a cross-sectional view illustrating a memory device including the pass transistor circuit of FIG. 18 according to an exemplary embodiment of the inventive concept.

FIG. 19 is a cross-sectional view illustrating a memory device 10g including the pass transistor circuit of FIG. 9 according to an exemplary embodiment of the inventive concept.

Referring to FIG. 19, the memory device 10g may include a memory cell array 100b, the plurality of vertical pass transistors TR1 to TRm, TRs, and TRg, and the plurality of driving signal lines SI1 to SIm, SS, and GS. The memory device 10g corresponds to a modification of the memory device 10a of FIG. 6 and the description previously given thereto is omitted.

The memory cell array 100b may be arranged in the cell area CA and may include the string selection line SSL, the plurality of word lines WL1 to WLm, the ground selection line GSL, the GIDL gate line GIDL, and the common source line CSL. The string selection line SSL, the plurality of word lines WL1 to WLm, the ground selection line GSL, and the GIDL gate line GIDL may be stacked in the vertical direction VD and may extend in the first horizontal direction HDL. The string selection line SSL, the plurality of word lines WL1 to WLm, the ground selection line GSL, and the GIDL gate line GIDL may be electrically insulated through a plurality of insulating layers.

The plurality of vertical pass transistors TR1 to TRm, TRs, and TRg may be arranged in the stair area SA of the plurality of word lines WL1 to WLm. The vertical pass transistor TRg may be connected between the ground selection line GSL and the ground selection line driving signal line GS. The vertical channels VC respectively included in the plurality of vertical pass transistors TR1 to TRm, TRs, and TRg may be commonly connected to the gate GT. In the current embodiment, the gate GT commonly connected to the vertical channels VC respectively included in the plurality of vertical pass transistors TR1 to TRm, TRs, and TRg may be arranged at the same level as that of the GIDL gate line GIDL.

The plurality of contacts CP1 to CPm, CPs, and CPg may be respectively arranged on the plurality of vertical pass transistors TR1 to TRm, TRs, and TRg. The plurality of vertical pass transistors TR1 to TRm may be respectively connected to the corresponding word lines WL1 to WLm through the corresponding contacts CP1 to CPm, the vertical pass transistor TRs may be connected to the string selection line SSL through the contact CPs, and the vertical pass transistor TRg may be connected to the ground selection line GSL through the contact CPg. In an exemplary embodiment of the inventive concept, heights of the plurality of contacts CP1 to CPm, CPs, and CPg in the vertical direction VD may be equal to each other as a second height H2'.

In an exemplary embodiment of the inventive concept, the row decoder 220b may be adjacent to the plurality of vertical pass transistors TR to TRm, TRs, and TRg in the first horizontal direction HD1 or the second horizontal direction HD2. However, the inventive concept is not limited thereto. At least one of the block decoder 221 and the driving signal line decoder 222*b* of the row decoder 220*b* may be arranged below the plurality of vertical pass transistors TR1 to TRm, TRs, and TRg in the vertical direction VD.

Figure 20:
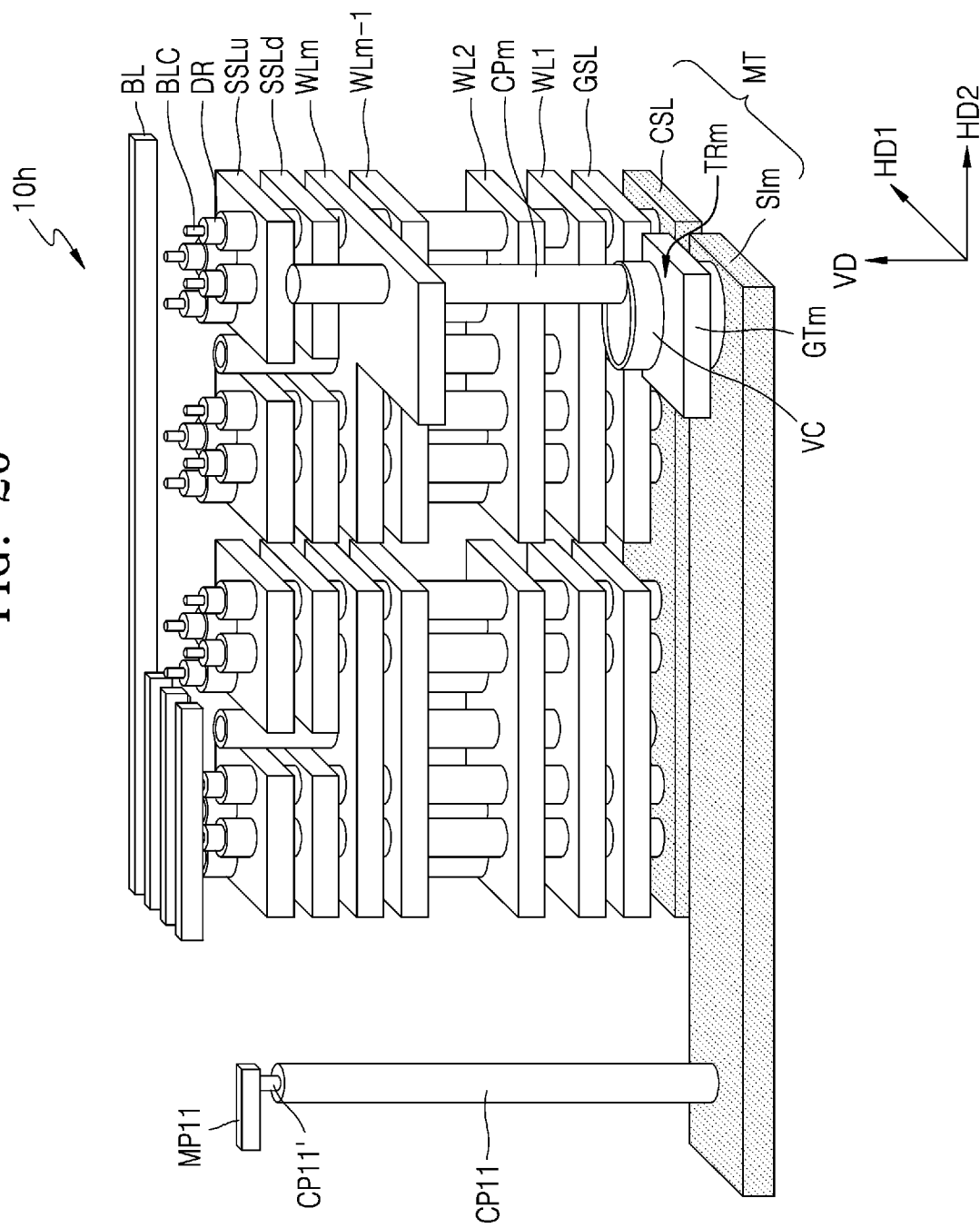
FIGS. 20, 21 and 22 are perspective views respectively illustrating memory devices according to exemplary embodiments of the inventive concept.

FIG. 20 is a perspective view illustrating a memory device 10*h* according to an exemplary embodiment of the inventive concept.

Referring FIG. 20, the memory device 10*h* may include a plurality of metal lines MT arranged to run parallel with each other in the first horizontal direction HD1 and extending in the second horizontal direction HD2. The plurality of metal lines MT may include the common source line CSL and the mth word line driving signal line SIm that are arranged at the same level. For example, the common source line CSL may be formed of a metal plate and the mth word line driving signal line SIm may be formed to be line-shaped.

The memory cell array (for example, 100 of FIG. 1) may be arranged above the common source line CSL. For example, the ground selection line GSL, the plurality of word lines WL1 to WLm, a lower string selection line SSLd, and an upper string selection line SSLu may be stacked above the common source line CSL in the vertical direction VD. The upper string selection line SSLu may include the first to fourth upper string selection lines (for example, SSLu1 to SSLu4 of FIG. 10) arranged at the same level. The plurality of vertical channel structures VP extend in the vertical direction VD and may pass through the ground selection line GSL, the plurality of word lines WL1 to WLm, the lower string selection line SSLd, and the upper string selection line SSLu.

The drain contacts DR are respectively provided on the plurality of vertical channel structures VP and the bit line contacts BLC may be respectively provided on the drain contacts DR. The drain contacts DR may be implemented by studs. The bit lines BL spaced apart from each other by a certain distance in the first horizontal direction HD1 and extending in the second horizontal direction HD2 are provided on the bit lines contacts BLC. In some embodiments of the inventive concept, the memory device 10*h* may not include the bit lines contacts BLC and the bit lines BL may be respectively arranged above the drain contacts DR.

The pass transistor circuit (for example, 210 of FIG. 1) may be arranged above the mth word line driving signal line SIm. For example, a gate GTm may be arranged above the mth word line driving signal line SIm and the vertical channel VC extending in the vertical direction VD may pass through the gate GTm. The gate GTm and the vertical channel VC may configure the vertical pass transistor TRm. The contact CPm extending in the vertical direction VD may be formed above the vertical channel VC and the contact CPm may electrically connect the mth word line WLm to the vertical channel VC.

In addition, contacts CP11 and CP11' extending in the vertical direction VD may be arranged above the mth word line driving signal line SIm and the metal pattern MP11 extending in the second horizontal direction HD2 may be arranged above the contact CP11'. For example, the contact CP11' may be arranged at the same level as that of the bit line contact BLC. For example, the metal pattern MP11 may be arranged at the same level as those of the bit lines BL. In some embodiments of the inventive concept, the memory device 10*d* may not include the contact CP11' and the metal pattern MP11 may be arranged above the contact CP11.

Figure 21:
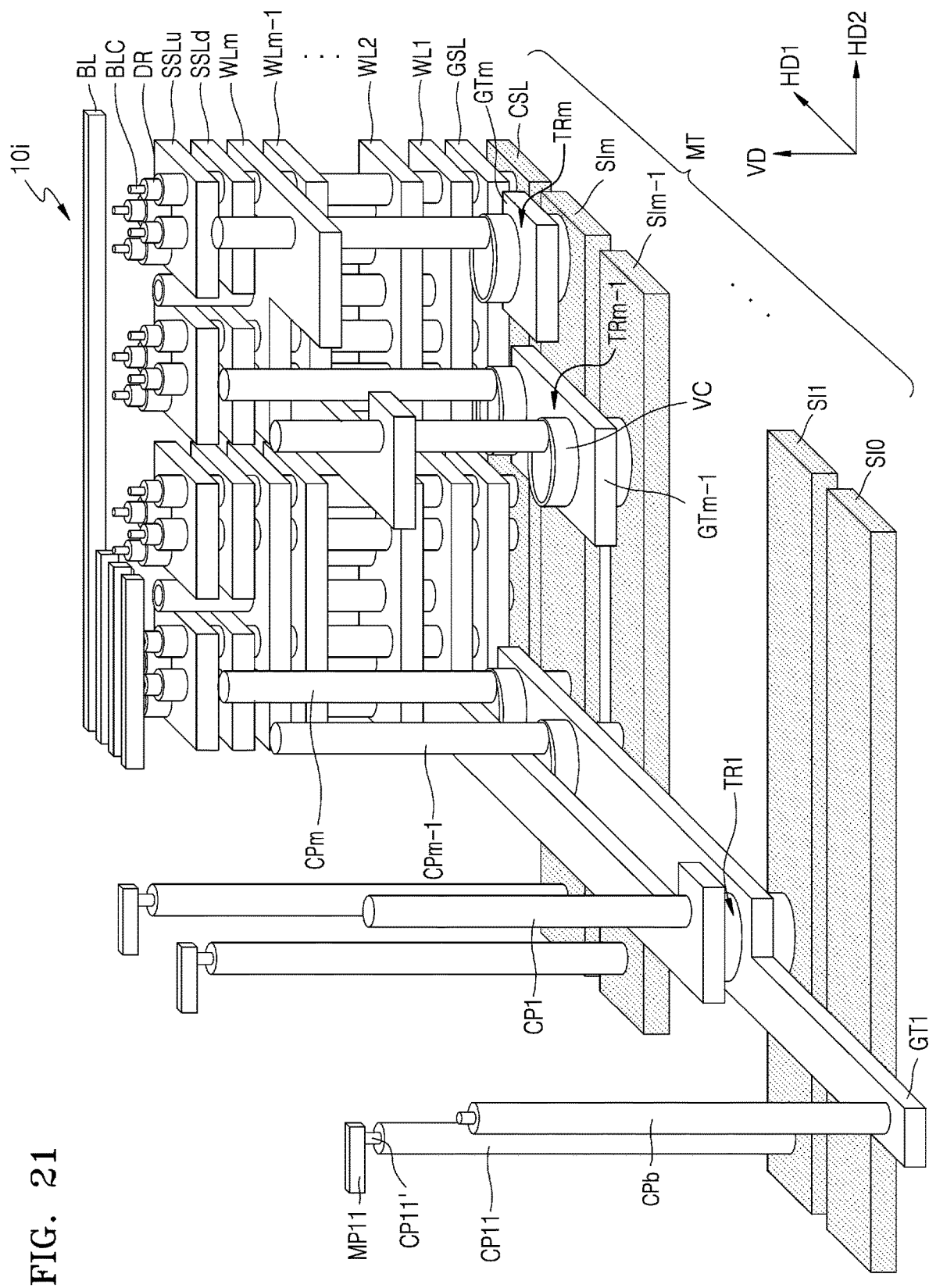

FIG. 21 is a perspective view illustrating a memory device 10*i* according to an exemplary embodiment of the inventive concept.

Referring FIG. 21, the memory device 10*i* may include the plurality of metal lines MT arranged to run parallel with each other in the first horizontal direction HD1 and extending in the second horizontal direction HD2. The plurality of metal lines MT may include the common source line CSL and the first to mth word line driving signal lines SI1 to SIm that are arranged at the same level. For example, the common source line CSL may be formed of a metal plate. The memory device 10*i* according to the current embodiment may further include first to (m−1)th word line driving signal lines SI1 to SIm−1 in comparison with the memory device 10*h* of FIG. 20. Therefore, the description previously given with reference to FIG. 20 may be applied to the current embodiment and is omitted.

The plurality of vertical channels VC and a plurality of gates GT1 to GTm may be arranged above the first to mth word line driving signal lines SI1 to SIm. The plurality of gates GT1 to GTm may extend in the first horizontal direction HD1 and may be spaced apart from each other by a certain distance in the second horizontal direction HD2.

In an exemplary embodiment of the inventive concept, lengths of the plurality of gates GT1 to GTm in the first horizontal direction HD may be different from each other. However, the inventive concept is not limited thereto. In some embodiments of the inventive concept, the lengths of the plurality of gates GT1 to GTm in the first horizontal direction HD1 may be equal to each other. In an exemplary embodiment of the inventive concept, the plurality of gates GT1 to GTm may be arranged at the same level as that of the ground selection line GSL. However, the inventive concept is not limited thereto. In some embodiments of the inventive concept, the plurality of gates GT1 to GTm may be arranged at the same level as that of the GIDL gate line.

In addition, the plurality of contacts CP1 to CPm extending in the vertical direction VD may be respectively arranged above the plurality of vertical channels VC and lengths of the plurality of contacts CP1 to CPm in the vertical direction VD may be equal to each other. For example, the vertical channel VC and the gate GT1 that are arranged above the first word line driving signal line SI1 may configure the first vertical pass transistor TR1. The contact CP1 arranged above the first vertical pass transistor TR1 may be electrically connected to the first word line WL1. In addition, the vertical channel VC and the gate GTm−1 that are arranged above the (m−1)th word line driving signal line SIm−1 may configure an (m−1)th vertical pass transistor TRm−1. The contact CPm−1 arranged above the (m−1)th vertical pass transistor TRm−1 may be electrically connected to an (m−1)th word line WLm−1.

On the other hand, the gate GT1 may be arranged above the first to mth word line driving signal lines SI1 to SIm, only the contact CP1 among the contacts CP1 to CPm arranged above the vertical channels VC formed to pass through the gate GT1 may be electrically connected to the first word line WL1, and the other contacts CPm−1 and CPm may not be electrically connected to the first word line WL1. For example, the other contacts CPm−1 and CPm may be connected to a nitride area (for example, NT of FIG. 11) of the first word line WL1, thereby preventing the other contacts CPm−1 and CPm from being electrically connected to the first word line WL1. The contact CP1 may be connected to a tungsten area (for example, W of FIG. 11) of the first word line WL1, thereby permitting the contact CP1 to electrically connect to the first word line WL1.

In addition, the gate GTm−1 may be arranged above the (m−1)th and mth word line driving signal lines SIm−1 and SIm, only the contact CPm−1 of the contacts CPm−1 and CPm arranged above the vertical channels VC formed to pass through the gate GTm−1 may be electrically connected to the (m−1)th word line WLm−1, and the other contact CPm may not be electrically connected to the (m−1)th word line WLm−1. For example, the other contact CPm may be connected to a nitride area (for example, NT of FIG. 11) of the (m−1)th word line WLm−1, thereby preventing the other contact CPm from being electrically connected to the (m−1)th word line WLm−1. The contact CPm−1 may be connected to a tungsten area (for example, W of FIG. 11) of the (m−1)th word line WLm−1, thereby permitting the contact CPm−1 to electrically connect to the (m−1)th word line WLm−1.

In addition, the plurality of metal lines MT may further include a metal line SI0 and the metal line SI0 may have the same structure as that of the first to mth word line driving signal lines SI1 to SIm. A contact CPb for receiving a block selection signal (for example, BS of FIG. 8) may be arranged on the gate GT1. A contact for receiving the block selection signal BS may also be arranged on other gates GTm−1 and GTm.

Figure 22:
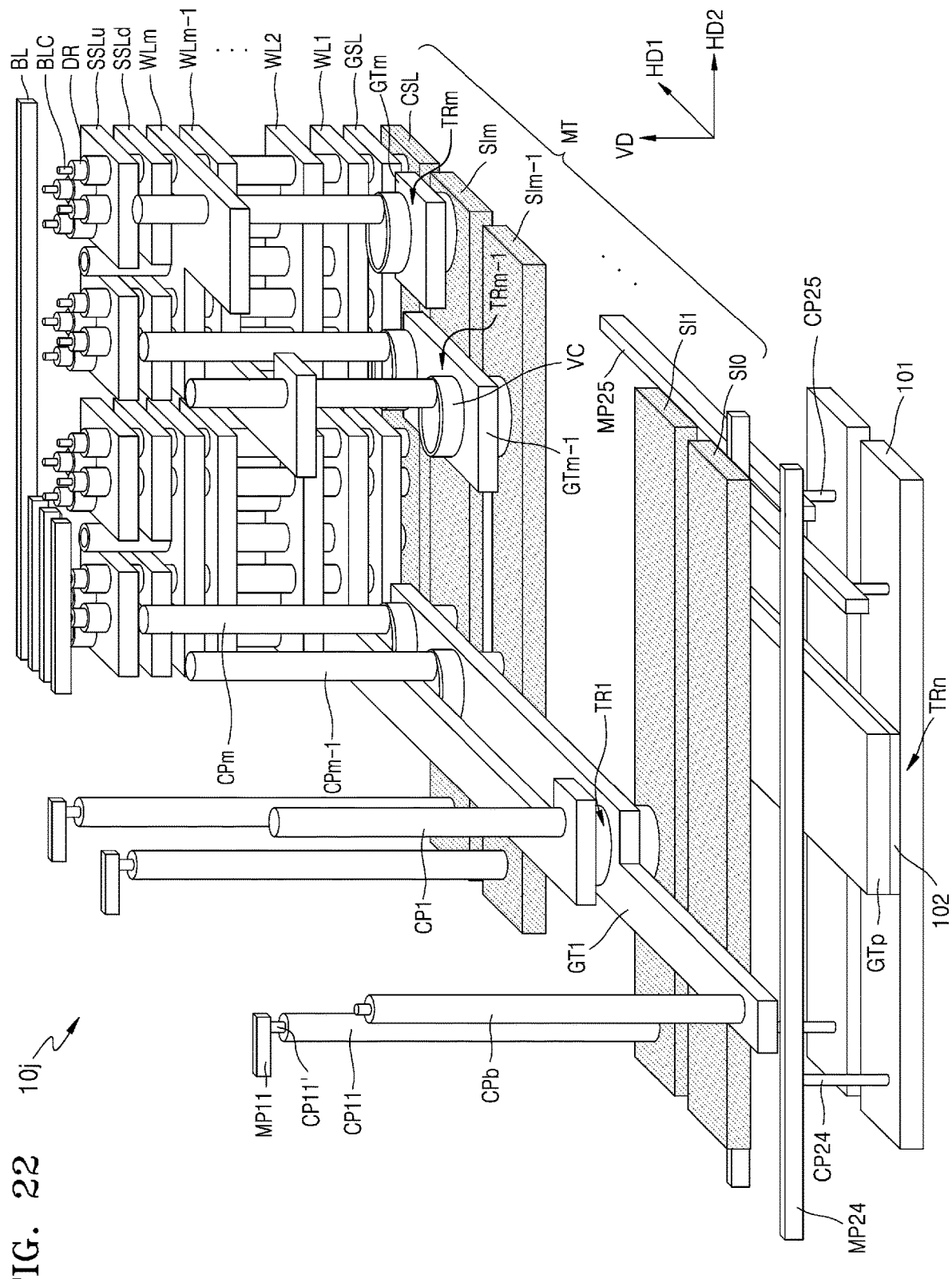

FIG. 22 is a perspective view illustrating a memory device 10*j* according to an exemplary embodiment of the inventive concept.

Referring FIG. 22, the memory device 10*j* corresponds to a modification of the memory device 10*i* of FIG. 21 and may further include at least one normal pass transistor TRn arranged below the plurality of metal lines MT in the vertical direction VD in comparison with the memory device 10*i*. For example, the plurality of metal lines MT, the vertical pass transistors TR1 to TRm, the contacts CP1 to CPm, the contacts CP11, CP11', and CPb, the metal pattern MP11, the ground selection line GSL, the plurality of word lines WL1 to WLm, the lower string selection line SSLd, the upper string selection line SSLu, and the vertical channel structures VP may be arranged in the first semiconductor layer (for example, L1 of FIG. 2). The normal pass transistor TRn may be arranged in the second semiconductor layer (for example, L2 of FIG. 2).

In an exemplary embodiment of the inventive concept, the memory device 10*j* may include an active area 101, a gate insulating layer 102, and a gate electrode layer GTp and the active area 101, the gate insulating layer 102, and the gate electrode layer GTp may configure the normal pass transistor TRn. The gate electrode layer GTp may extend in the first horizontal direction HD1. Contacts CP24 and CP25 extending in the vertical direction VD may be arranged on the active area 101. For example, the contacts CP24 and CP25 may respectively correspond to a source contact and a drain contact. A metal pattern MP24 extending in the second horizontal direction HD2 may be arranged on the contact CP24 and a metal pattern MP25 extending in the first horizontal direction HD1 may be arranged on the contact CP25. For example, the metal pattern MP24 may be arranged above the metal pattern MP25 in the vertical direction VD. However, the inventive concept is not limited thereto.

According to the current embodiment, the memory device 10*j* may include a hybrid pass transistor circuit including the vertical pass transistors TR1 to TRm and the normal pass transistor TRn. For example, the normal pass transistor TRn may be connected to the ground selection line GSL. However, the inventive concept is not limited thereto.

Figure 23:
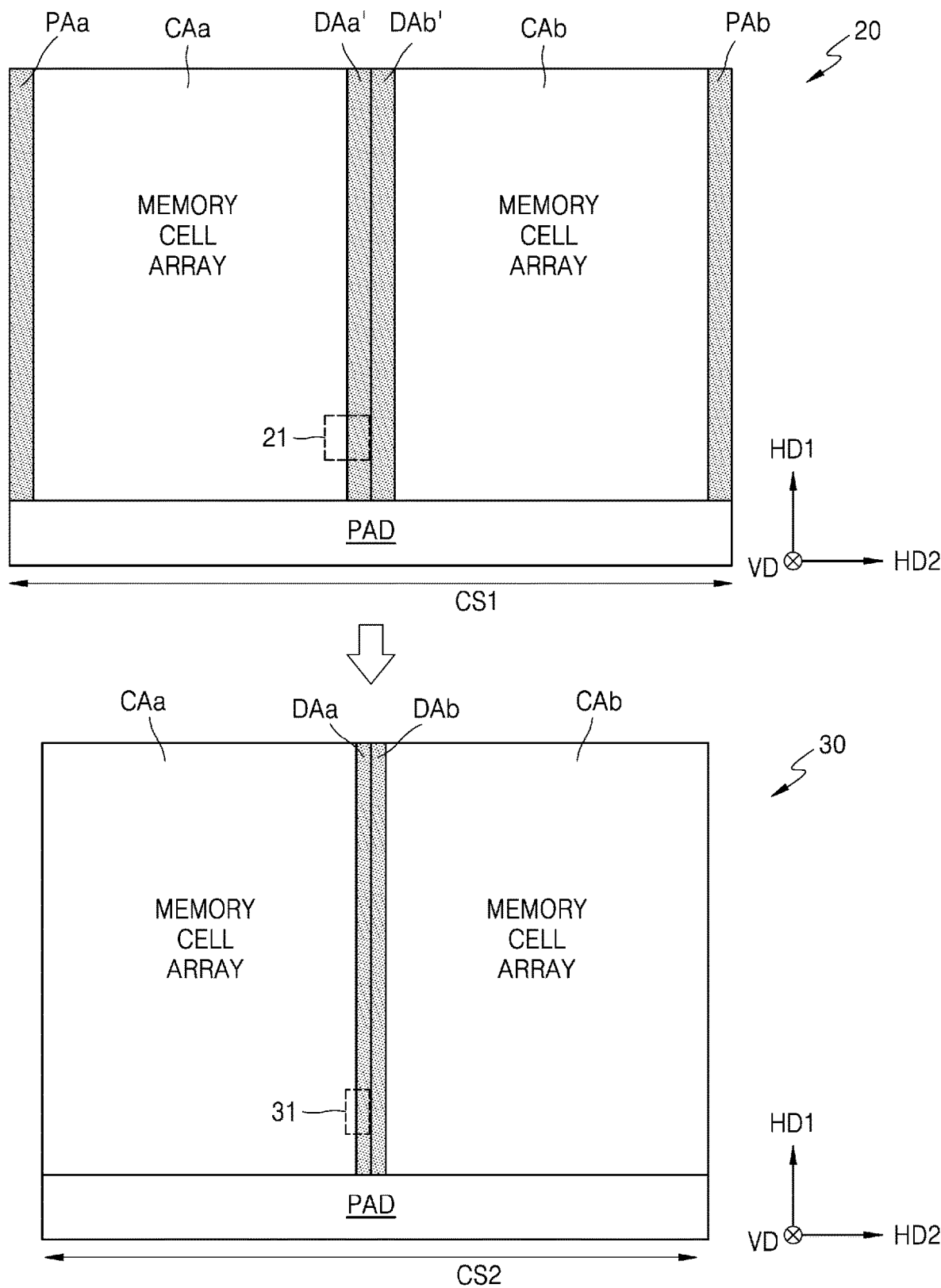
FIG. 23 illustrates a top surface of a memory device according to a comparative example and a top surface of a memory device according to an exemplary embodiment of the inventive concept.
Figure 24:
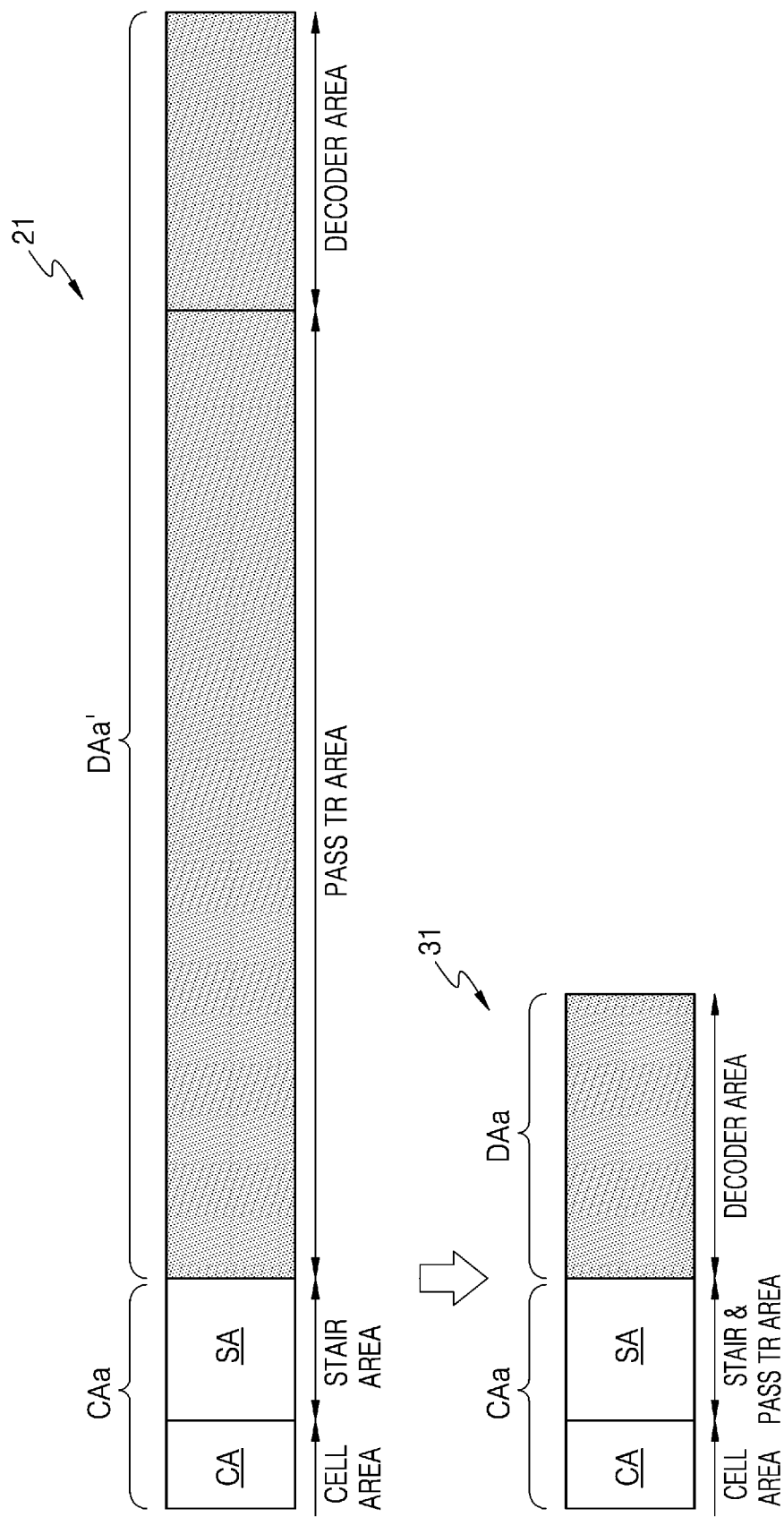
FIG. 24 is an enlarged view of a first area and a second area of FIG. 23.

FIG. 23 illustrates a top surface of a memory device 20 according to a comparative example and a top surface of a memory device 30 according to an exemplary embodiment of the inventive concept. FIG. 24 is an enlarged view of a first area 21 and a second area 33 of FIG. 23.

Referring to FIGS. 23 and 24, the memory device 20 may include first and second cell areas CAa and CAb, first and second pass transistor circuit areas PAa and PAb, first and second decoder areas DAa' and DAb', and a pad area PAD. The memory device 20 may have a first chip size CS1 in the second horizontal direction HD2.

A first memory cell array is arranged in the first cell area CAa and a second memory cell array may be arranged in the second cell area CAb. In the first pass transistor circuit area PAa, a plurality of pass transistors connected to gate lines, in other words, a string selection line, a ground selection line, and word lines included in the first memory cell array may be arranged. In the second pass transistor circuit area PAb, a plurality of pass transistors connected to gate lines, in other words, a string selection line, a ground selection line, and word lines included in the second memory cell array may be arranged. In a first decoder area DAa', a row decoder and pass transistors that are connected to the first memory cell array may be arranged. In a second decoder area DAb', a row decoder and pass transistors that are connected to the second memory cell array may be arranged.

For example, the first area 21 may include a pan of the first cell area CAa and the first decoder area DAa'. Apart of the first cell area CAa may include the cell area CA in which the vertical channel structures (for example, VP of FIG. 6) are arranged and the stair area SA of the word lines. The first decoder area DAa may include an area in which a pass transistor circuit is arranged and an area in which a row decoder is arranged. In this case, the pass transistor circuit may include normal pass transistors, in other words, planar pass transistors. As described above, a ratio of the area in which the pass transistor circuit is arranged to the first decoder area DAa' is very high. Therefore, the first chip size CS1 of the memory device 20 may be great.

On the other hand, the memory device 30 according to an exemplary embodiment of the inventive concept may include the first and second cell areas CAa and CAb, the first and second decoder areas DAa and Dab, and the pad area PAD. The memory device 30 may have a second chip size CS2 in the second horizontal direction HD2. The first memory cell array may be arranged in the first cell area CAa and the second memory cell array may be arranged in the second cell area CAb. The row decoder connected to the first memory cell array may be arranged in the first decoder area DAa and the row decoder connected to the second memory cell array may be arranged in the second decoder area DAb.

According to the current embodiment, the memory device 30 does not include the first and second pass transistor circuit areas PAa and PAb in comparison with the memory device 20. In addition, lengths of the first and second decoder areas DAa and Dab in the second horizontal direction HD2 may be less than those of the first and second decoder areas DAa' and Dab' in the second horizontal direction HD2. Therefore, the second chip size CS2 may be less than the first chip size CS1.

For example, the second area 31 may include a part of the first cell area CAa and the first decoder area DAa. A part of the first cell area CAa may include the cell area CA in which the vertical channel structures (for example, VP of FIG. 6) are arranged and the stair area SA of the word lines. The first decoder area DAa may include an area in which the row decoder (for example, 220 of FIG. 1) is arranged. In an exemplary embodiment of the inventive concept, the pass transistors may be implemented by the vertical pass transistors and the vertical pass transistors may be arranged in the stair area SA of the word lines. Therefore, the area in which the pass transistor circuit (for example, 210 of FIG. 1) is arranged may be included in the first cell area CAa. Therefore, a length of the first decoder area DAa in the second horizontal direction HD2 may be less than that of the first decoder area DAa' in the second horizontal direction.

Figure 25:
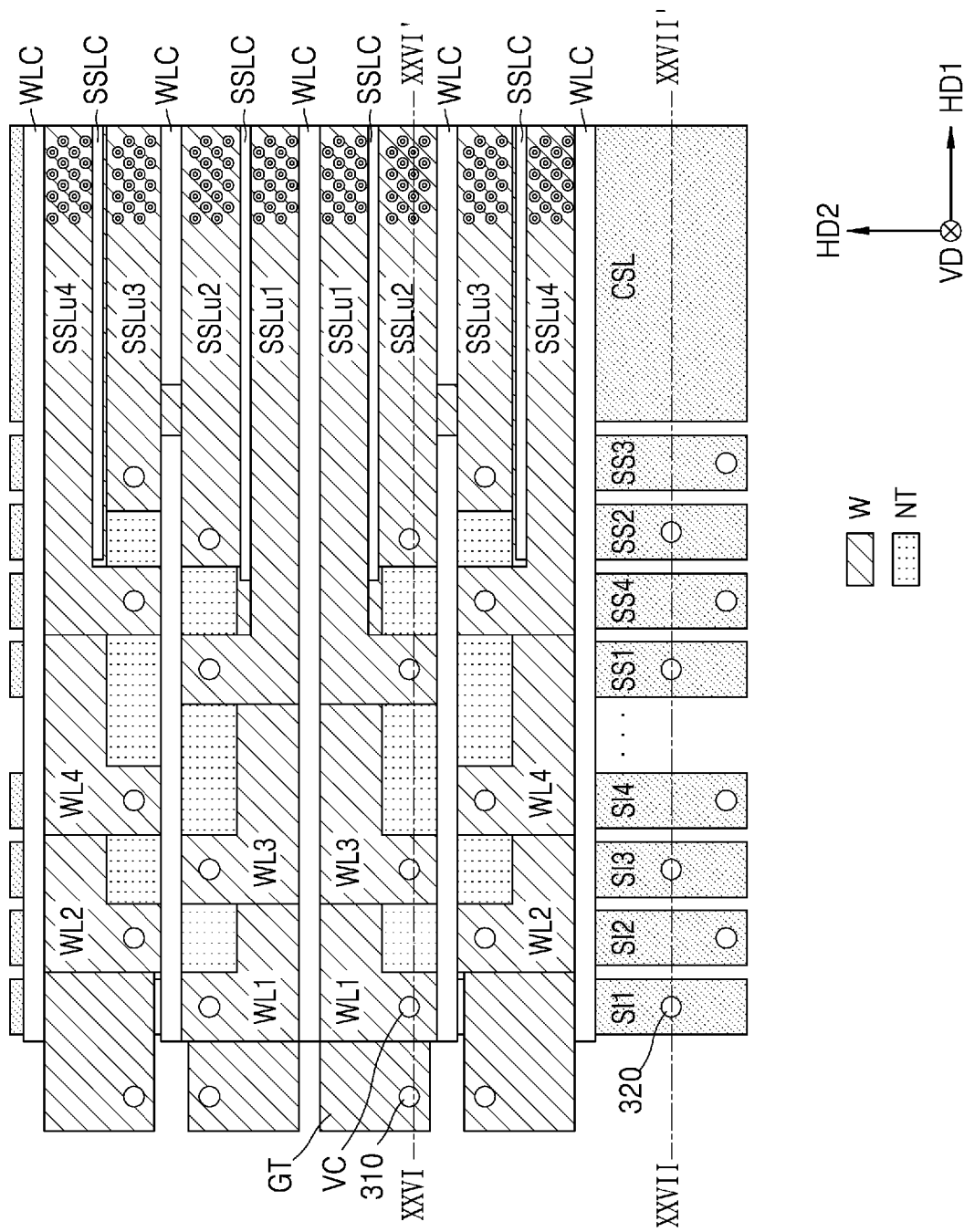
FIG. 25 is a top view illustrating a first surface of a first semiconductor layer included in a memory device according to an exemplary embodiment of the inventive concept.

FIG. 25 is a top view illustrating a first surface of a first semiconductor layer 300 included in a memory device according to an exemplary embodiment of the inventive concept.

Referring to FIG. 25, the first semiconductor layer 300 may include the plurality of driving signal lines SI1 to SI4 and SS1 to SS4 and the common source line CSL that are arranged at the same level. For example, the plurality of driving signal lines SI to SI4 and SS1 to SS4 extend in the second horizontal direction HD2 and may be spaced apart from each other by a certain distance in the first horizontal direction HD. The gate GT is arranged above the plurality of driving signal lines SI1 to SI4 and SS1 to SS4 in the vertical direction VD and may extend in the first horizontal direction HD1. The first to fourth word lines WL1 to WL4 may be sequentially stacked above the gate GT in the vertical direction VD. In an exemplary embodiment of the inventive concept, in the first semiconductor layer 300, a substrate may be arranged on a second surface that faces the first surface. Therefore, the plurality of driving signal lines SI1 to S4 and SS1 to SS4 and the common source line CSL may be arranged on the substrate.

Figure 26:
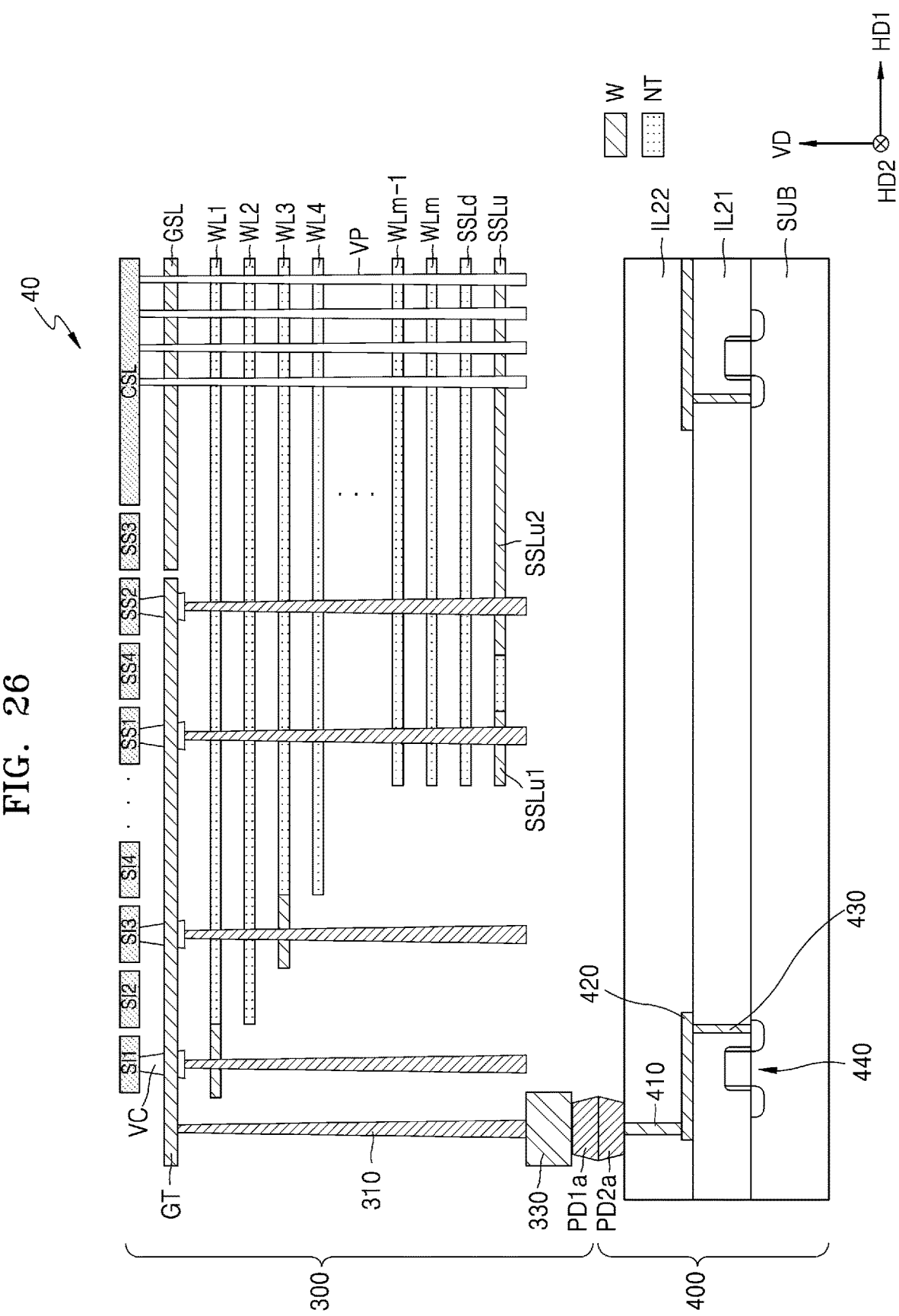
FIGS. 26 and 27 illustrate a memory device according to an exemplary embodiment of the inventive concept.
Figure 27:
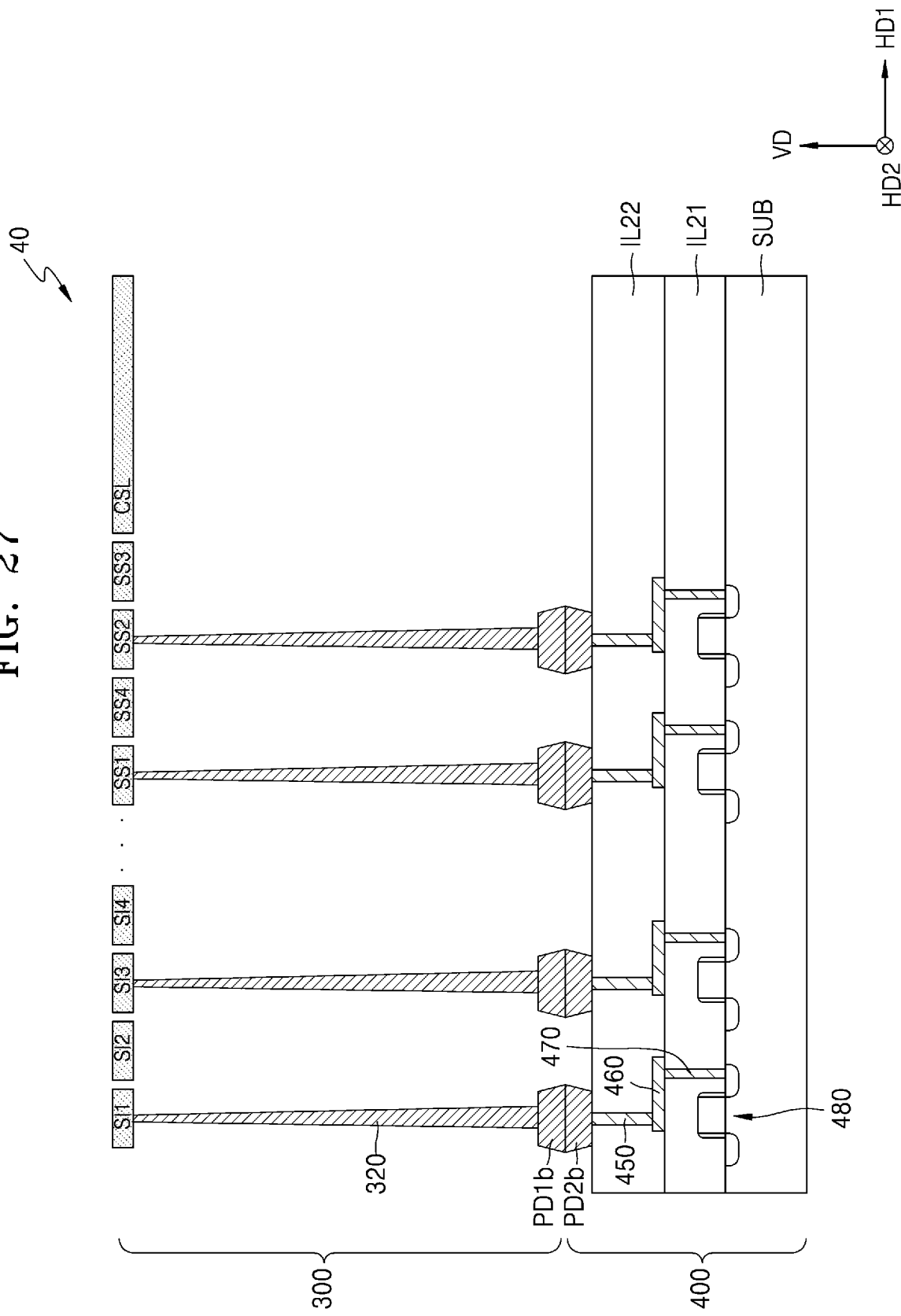

FIGS. 26 and 27 illustrate a memory device 40 according to an exemplary embodiment of the inventive concept. For example, the first semiconductor layer 300 of FIG. 26 illustrates a cross-section taken along line XXVI-XXVI' of FIG. 25 and the first semiconductor layer 300 of FIG. 27 illustrates a cross-section taken along line XXVII-XXVII' of FIG. 25.

Referring to FIGS. 26 and 27, the first semiconductor layer 300 may be combined with a second semiconductor layer 400 by, for example, Cu to Cu (C2C) wafer bonding. In this case, a plurality of bonding pads PD1a and PD1b may be formed on the first surface of the first semiconductor layer 300 and a plurality of bonding pads PD2a and PD2b may be formed on the first surface of the second semiconductor layer 400. Therefore, the first semiconductor layer 300 of FIG. 25 is turned over and accordingly, the first surface of the first semiconductor layer 300 may be combined with the first surface of the second semiconductor layer 400. In an exemplary embodiment, an input/output (I/O) pad forming process and a back lap process may be sequentially performed on the second surface of the first semiconductor layer 300.

The gate GT may be connected to a transistor 440 through a wiring line including a contact 310, a metal pattern 330, and a bonding pad PD1a included in the first semiconductor layer 300, and a bonding pad PD2a, contacts 410 and 430, and a metal pattern 420 included in the second semiconductor layer 400. In addition, the word line driving signal line SI may be connected to a transistor 480 through a wiring line including a contact 320 and a bonding pad PD1b included in the first semiconductor layer 300, and a bonding pad PD2b, contacts 450 and 470, and a metal pattern 460 included in the second semiconductor layer 400.

Figure 28:
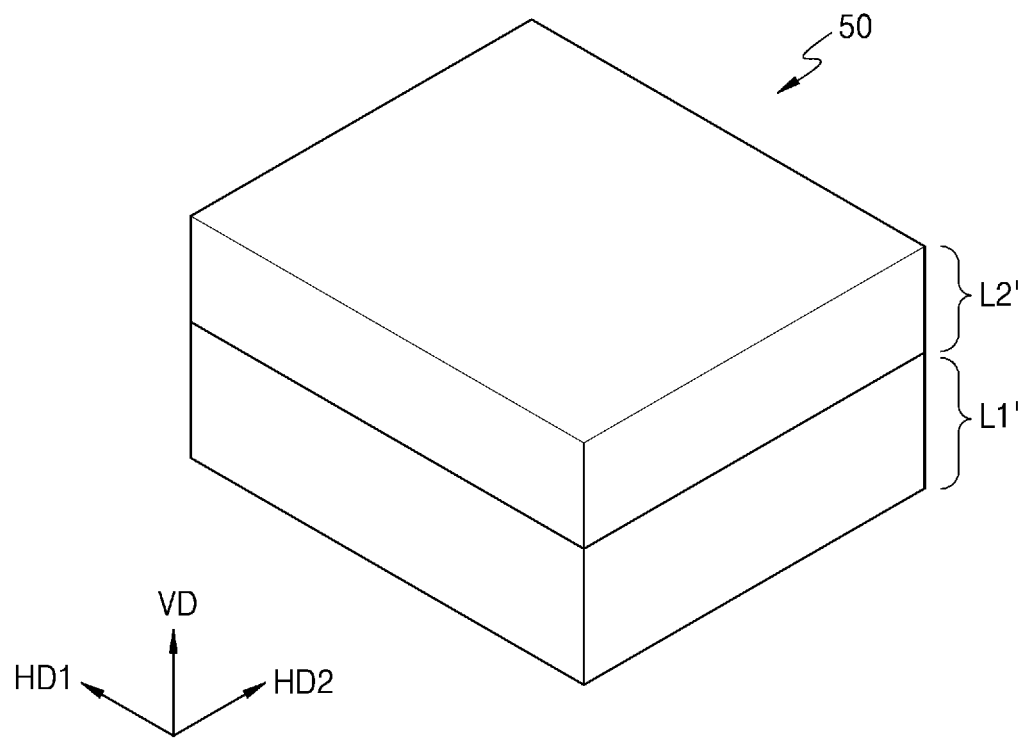
FIG. 28 illustrates a structure of a memory device according to an exemplary embodiment of the inventive concept.

50) FIG. 28 illustrates a structure of a memory device 50 according to an exemplary embodiment of the inventive concept.

Referring to FIGS. 1 and 28, the memory device 50 may include a first semiconductor layer L1' and a second semiconductor layer L2' and the second semiconductor layer L2' may be stacked on the first semiconductor layer L1' in the vertical direction VD. For example, the first and second semiconductor layers L I' and L2 may be combined by wafer bonding and the second semiconductor layer L2' may be arranged above the first semiconductor layer L' in the vertical direction VD.

In an exemplary embodiment of the inventive concept, the memory cell array 100, the pass transistor circuit 210, and the row decoder 220 may be formed in the first semiconductor layer L1' and the control logic 230 and the page buffer 240 may be formed in the second semiconductor layer L2'. Therefore, the memory device 50 may have a structure in which the memory cell array 100 is arranged below a partial peripheral circuit, in other words, a peripheral over cell (POC) structure. In the POC structure, a horizontal direction area may be reduced and integrity of the memory device 50 may increase.

In an exemplary embodiment of the inventive concept, each of the first and second semiconductor layers L1' and L2' may include a substrate and, after the memory cell array 100, the pass transistor circuit 210, and the row decoder 220 are formed in the first semiconductor layer L1', and circuits including the control logic 230 and the page buffer 240 are formed in the second semiconductor layer L2', the first and second semiconductor layers L1' and L2' may be combined by the C2C wafer bonding.

Figure 29:
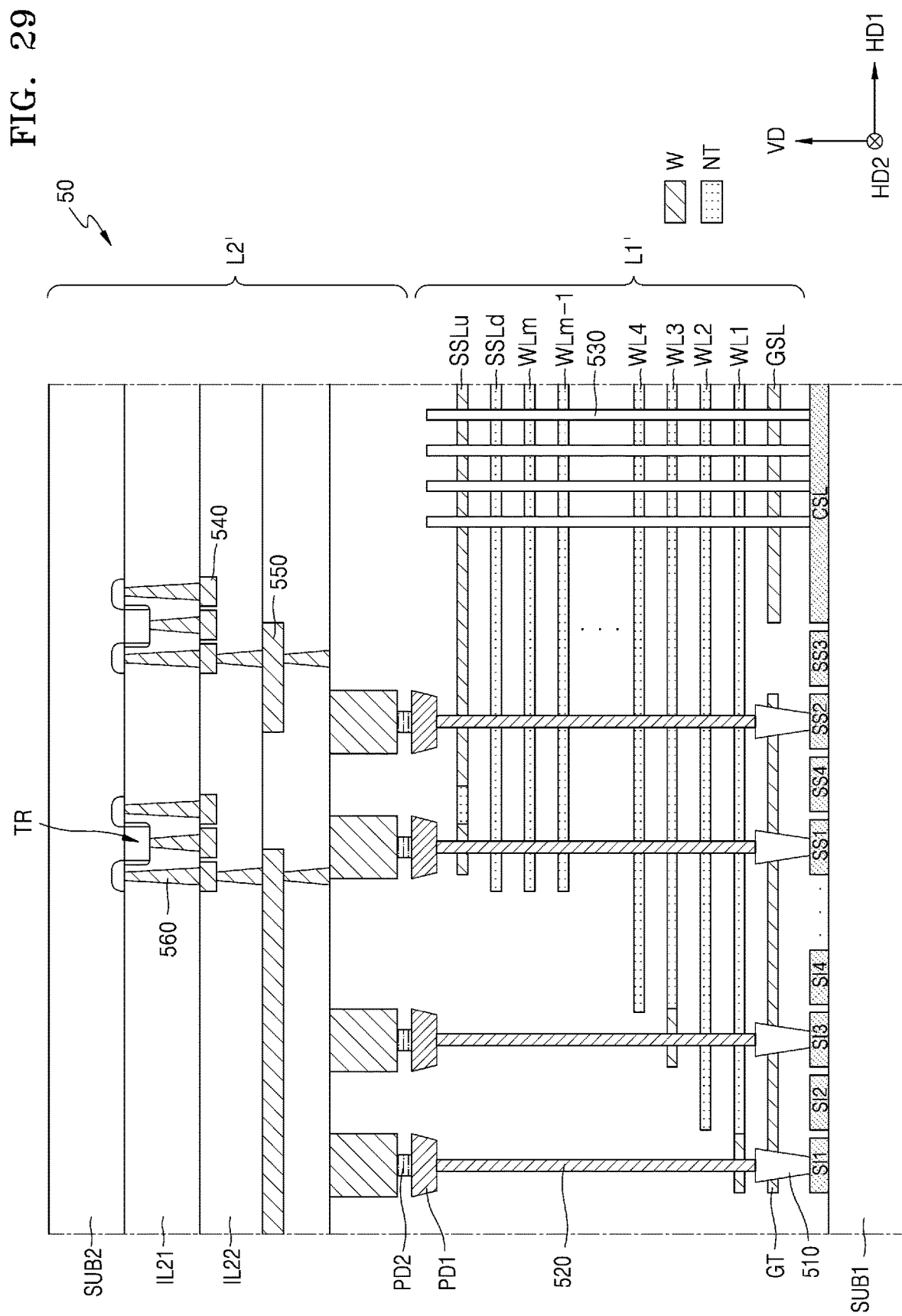
FIG. 29 is a cross-sectional view illustrating the memory device of FIG. 28 according to an exemplary embodiment of the inventive concept.

FIG. 29 is a cross-sectional view illustrating the memory device 50 of FIG. 28 according to an exemplary embodiment of the inventive concept.

Referring to FIG. 29, the first semiconductor layer L1' may include a first substrate SUB1, the plurality of driving signal lines SI1 to SI4 and SS1 to SS4, the common source line CSL, the gate GT, the ground selection line GSL, the word lines WL1 to WLm, the lower string selection line SSLd, and the upper string selection line SSLu. In addition, the first semiconductor layer L' may further include a plurality of vertical channels 510, a plurality of contacts 520, and a plurality of bonding pads PD1 respectively connected to the plurality of contacts 520. In addition, the first semiconductor layer L' may further include a plurality of vertical channel structures 530. The second semiconductor layer L2' may include a second substrate SUB2, a transistor TR, metal layers 540 and 550, a contact 560, and a plurality of bonding pads PD2.

Figure 30:
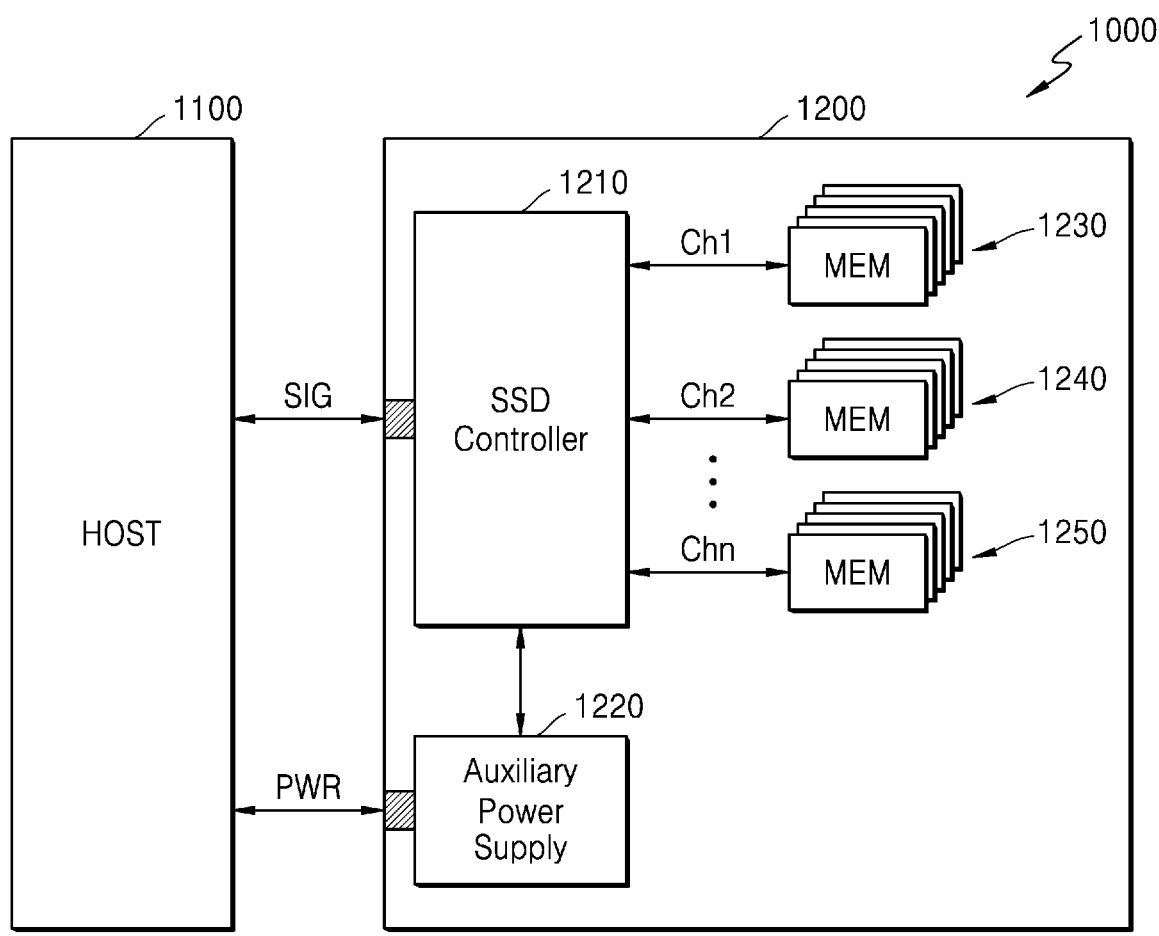
FIG. 30 is a block diagram illustrating an example in which a memory device according to exemplary embodiments of the inventive concept is applied to a solid state drive (SSD) system.

FIG. 30 is a block diagram illustrating an example in which a memory device according to exemplary embodiments of the inventive concept is applied to a solid state drive (SSD) system 1000.

Referring to FIG. 30, the SSD system 1000 may include a host 1100 and an SSD 1200. The SSD 1200 transmits and receives a signal (SIG) to and from the host 1100 through a signal connector and receives power (PWR) through the power connector. The SSD 1200 may include an SSD controller 1210, an auxiliary power supply 1220, and memory devices 1230, 1240, and 1250. The memory devices 1230, 1240, and 1250 may be implemented by using the above-described embodiments with reference to FIGS. 1 to 29. The memory devices 1230, 1240, and 1250 may be connected to the SSD controller 1210 via channels Ch2, Ch2 . . . Chn.

Figure 31:
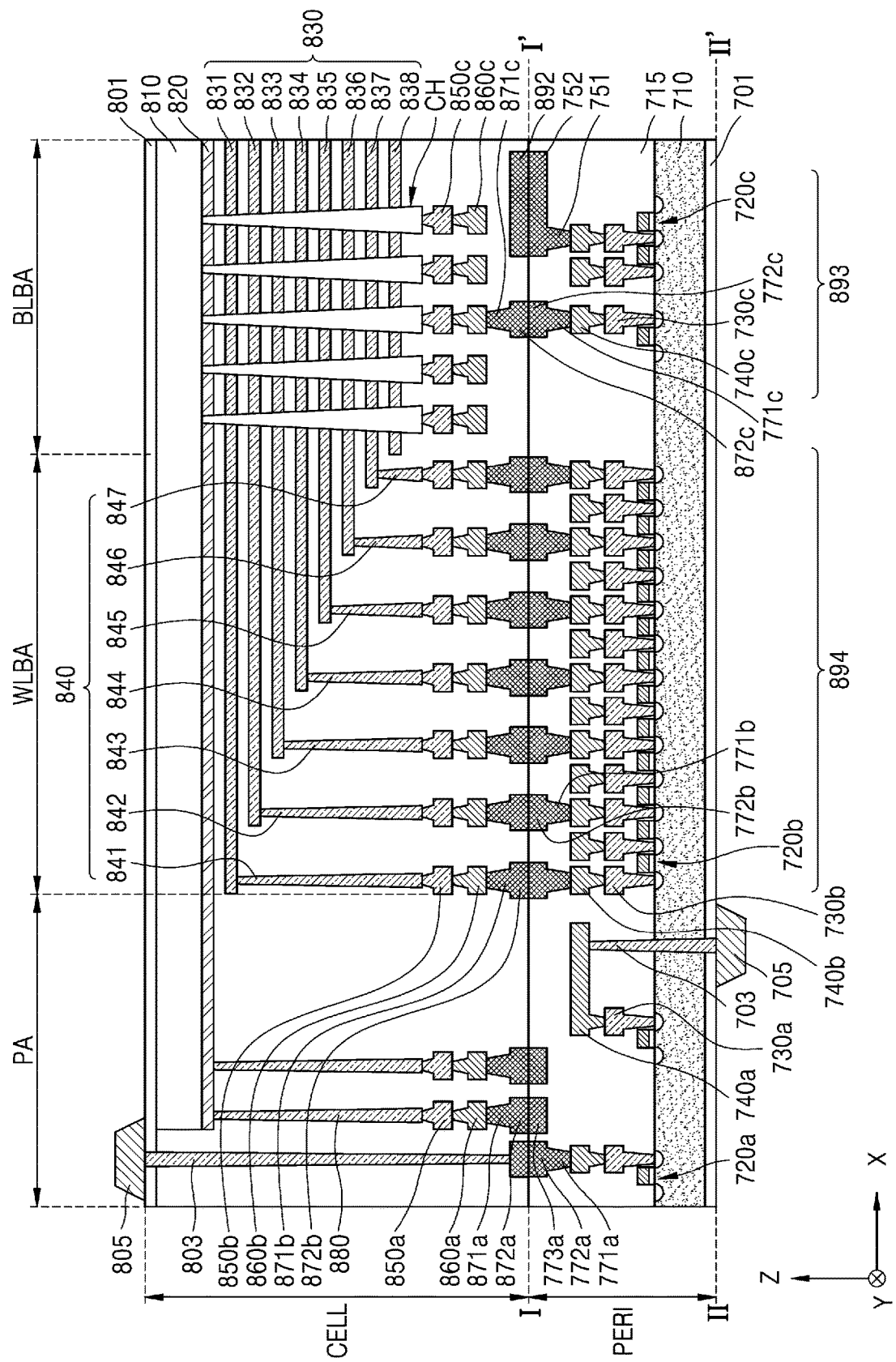
FIG. 31 illustrates a memory device having a chip-to-chip structure, according to an exemplary embodiment of the inventive concept.

FIG. 31 illustrates a memory device 900 having a chip-to-chip structure, according to exemplary embodiments of the inventive concept.

Referring to FIG. 31, a memory device 900 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high resistance, and the second metal layers 740a, 740b, and 740c may be formed of copper having relatively low resistance.

In an example embodiment illustrated in FIG. 31, although the first metal layers 730a, 730b, and 730c and the second metal layers 740a, 740b, and 740 care shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to upper bonding metals 871b and 872b in a bonding manner, and the lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 31, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a second direction (an X-axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 31, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 31, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803. For example, the second input-output contact plug 803 may be connected to the circuit element 720a through lower bonding metals 771a and 772a.

According to embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 31, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773a, corresponding to an upper metal pattern 872a formed in an uppermost metal layer of the cell region CELL, and having the same shape as the upper metal pattern 872a of the cell region CELL, in an uppermost metal layer of the peripheral circuit region PERI. In the peripheral circuit region PER, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PER, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu—Cu bonding.

Further, in the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PER, may be formed in an uppermost metal layer of the cell region CELL. A contact may not be formed on the upper metal pattern 892 formed in the uppermost metal layer of the cell region CELL. For example, the lower metal pattern 752 may be connected to the circuit element 720c through a lower bonding metal 751.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concept has been particularly shown and described with reference to exemplary embodiments thereof, it will be understood that various changes in form and details may be made thereto without departing from the spirit and scope of the inventive concept as set forth in the following claims.

What is claimed is:
1. A non-volatile memory device, comprising
a memory cell region including a first metal pad and an input-output (IO) pad;
a peripheral circuit region including a second metal pad and vertically connected to the met Cory cell region by the first metal pad and the second metal pad;
a memory cell array in the memory cell region, the memory cell array including a plurality of wordlines extended in a first direction and stacked in a second direction substantially perpendicular to the first direction; and
a plurality of pass transistors in the memory cell region, wherein a first pass transistor of the plurality of pass transistors is disposed between a first signal line of a plurality of signal lines and a first wordline of the plurality of wordlines, and
wherein the plurality of signal lines are arranged at the same level as a common source line, and
wherein the IO pad is connected to a circuit element disposed in the peripheral circuit region through an IO contact plug,
wherein the non-volatile memory device further comprises a gate in the memory cell region, the gate extending in the first direction between the plurality of signal lines and the plurality of wordlines wherein the first pass transistor includes a channel extending in the second direction from the first signal line through the gate,
wherein a width of the channel between the gate and the first wordline is greater than a width of the channel below the gate, wherein the memory cell array further includes a plurality of channel structures extending in the second direction from the common source line through a ground selection line, and wherein a first channel structure of the plurality of channel structures has a first width at an area between the ground selection line and the first wordline, the channel of the first pass transistor has a second width at an area between the gate and the first wordline, the second width being greater than the first width.

2. The non-volatile memory device of claim 1, wherein the first pass transistor is a vertical pass transistor, and wherein each of the plurality of pass transistors includes a vertical channel, wherein tops of the vertical channels are below the first wordline.

3. The non-volatile memory device of claim 1, wherein the tops of the vertical channels are at the same level as each other, and wherein the second width is at least two times the first width.

4. The non-volatile memory device of claim 1, wherein the plurality of pass transistors are formed in an area where the plurality of wordlines form a staircase shape.

5. The non-volatile memory device of claim 1, wherein the memory cell region is stacked on the peripheral circuit region in the second direction, the peripheral circuit region further including a second transistor, the second transistor being electrically connected to the first pass transistor, and wherein the s coed transistor is included in a row decoder.

6. The non-volatile memory device of claim 1, further comprising a gate in the memory cell region, the gate connected to at least one of the pass transistors, wherein the gate is arranged at the same level as around select line.

7. The non-volatile memory device of claim 1, wherein the pass transistors are commonly connected to a gate line, and wherein the pass transistors are provided with a same block selection signal.

8. The non-volatile memory device of claim 1, wherein the first me pad and the second metal pad formed of copper.

9. The non-volatile memory device of claim 1, wherein the first metal pad and the second metal pad are connected by a bonding manner.

10. The non-volatile memory device of claim 1, wherein the memory cell region is formed on a first wafer and the peripheral circuit region is formed on a second wafer.

11. A memory device, comprising:
a memory cell region including a first metal pad and an input-output (IO) pad;
a peripheral circuit region including a second metal pad and vertically connected to the memory cell region by the first metal pad and the second metal pad;
a memory cell array in the memory cell region, the memory cell array including a plurality of wordlines stacked in a vertical direction; and
a plurality of vertical pass transistors in the memory cell region, wherein a first vertical pass transistor of the plurality of vertical pass transistors includes a first vertical channel extending in the vertical direction between a first driving signal line and a first wordline of the plurality of wordlines, wherein the first vertical channel is disposed near an end of the first wordline, and
wherein the first driving signal line is arranged in the same layer as a common source line, the common source line being connected to a bit line through a contact structure passing through a ground select line at the same level as a gate, and wherein the IO pad is connected to a circuit element disposed in the peripheral circuit region through an IO contact plug.

12. The memory device of claim 11, wherein the first driving signal line is disposed on a base layer in the memory cell region and extends horizontally, the first driving signal line being connected to a transistor included in the peripheral circuit region, and wherein the first driving signal line is connected to the transistor in the peripheral circuit region through contacts and a metal pattern in the memory cell region.

13. The memory device of claim 11, wherein the plurality of vertical pass transistors includes a second vertical pass transistor including a second vertical channel extending in the vertical direction between a second driving signal line and a second wordline of the plurality of wordlines, the second vertical channel being disposed near an end of the second wordline.

14. The memory device of claim 13, wherein the end of the second wordline is closer to a cell area of the memory cell array than the end of the first wordline, wherein the first and second vertical channels have the same height as each other in the vertical direction, and wherein top surfaces of the first and second vertical channels are below a bottom surface of the first wordline.

15. The memory device of claim 11, wherein the first wordline includes a tungsten area and nitride area, and wherein the tungsten area is connected to a contact and the contact and the first vertical channel are connected to each other via the tungsten area.

16. The memory device of claim 11, wherein the gate is disposed in the memory cell region, the gate being disposed between the first driving signal line and the first wordline; and the ground select line is disposed in the memory cell region, the ground select line being disposed between the common source line and the first wordline, and wherein at least a part of a row decoder is disposed in the peripheral circuit region below the memory circuit region.

17. The memory device of claim 11, wherein the first wordline connected to the first driving signal line is provided with a program voltage and a second wordline connected to a second driving signal line is provided with a pass voltage, and wherein the program voltage is about 10V to about 25V and the pass voltage is about 5V to about 15V.

18. A memory device, comprising:
a memory cell region including:
a memory cell array including a plurality of wordlines stacked in a vertical direction,
a plurality of pass transistors,
a first pass transistor of the plurality of pass transistors being connected to a driving signal line,
a gate line arranged on the same layer as a ground select line, a first metal pad, and an input-output (IO) pad; and
a peripheral circuit region including a second metal pad and vertically connected to the memory cell region by the first metal pad and the second metal pad,
wherein the peripheral circuit region further includes a first transistor connected to a contact, the contact being connected to a second bonding pad, the second bonding pad being connected to the first bonding pad, wherein the first pass transistor is connected to the gate line, the gate line being connected to a contact, the contact being connected to a first bonding pad, wherein the plurality of wordlines have a step-wise shape in an area where the first pass transistor is located, wherein the IO pad is connected to a circuit element disposed in the peripheral circuit region through an IO contact plug, and wherein a channel of the first pass transistor has a first width at an area between a gate and a first wordline, and a channel passing through the first wordline and the gate to a common source line has a second width at an area between the gate and the first wordline, the second width being less than the first width.

* * * * *